United States Patent
Tsutsumi et al.

(10) Patent No.: US 7,879,655 B2
(45) Date of Patent: Feb. 1, 2011

(54) SEMICONDUCTOR DEVICE AND A MANUFACTURING METHOD OF THE SAME

(75) Inventors: Yasumi Tsutsumi, Tokyo (JP); Takashi Miwa, Tokyo (JP)

(73) Assignee: Renesas Electronics Corporation, Kawasaki-shi (JP)

( * ) Notice: Subject to any disclaimer, the term of this patent is extended or adjusted under 35 U.S.C. 154(b) by 0 days.

(21) Appl. No.: 12/685,403

(22) Filed: Jan. 11, 2010

(65) Prior Publication Data

US 2010/0112761 A1 May 6, 2010

Related U.S. Application Data

(62) Division of application No. 11/520,816, filed on Sep. 14, 2006, now Pat. No. 7,656,019.

(30) Foreign Application Priority Data

Sep. 30, 2005 (JP) .............................. 2005-287775

(51) Int. Cl.
*H01L 23/48* (2006.01)
(52) U.S. Cl. .................. 438/124; 438/106; 438/612; 438/666; 438/123; 438/E23.039
(58) Field of Classification Search .................. 438/106, 438/123, 124–612, 666, E23.039; 257/690, 257/678, 734, E23.043
See application file for complete search history.

(56) References Cited

U.S. PATENT DOCUMENTS

| | | | |
|---|---|---|---|
| 6,476,506 B1 * | 11/2002 | O'Connor et al. | 257/786 |
| 6,812,580 B1 * | 11/2004 | Wenzel et al. | 257/784 |
| 7,250,684 B2 * | 7/2007 | Nickerson et al. | 257/777 |
| 2003/0011038 A1 | 1/2003 | Kida | |
| 2003/0218245 A1 | 11/2003 | Matsuzawa et al. | |
| 2004/0164385 A1 | 8/2004 | Kado et al. | |
| 2004/0207067 A1 | 10/2004 | Ma | |

FOREIGN PATENT DOCUMENTS

| | | |
|---|---|---|
| JP | 6-34983 A | 2/1994 |
| JP | 2001-144214 A | 5/2001 |
| JP | 2003-31610 A | 1/2003 |

* cited by examiner

*Primary Examiner*—Cuong Q Nguyen
*Assistant Examiner*—Trang Q Tran
(74) *Attorney, Agent, or Firm*—Miles & Stockbridge P.C.

(57) ABSTRACT

A semiconductor device is disclosed wherein first wiring lines in a first row extend respectively from first connecting portions toward one side of a semiconductor chip, while second wiring lines extend respectively from second connecting portions toward the side opposite to the one side of the semiconductor chip. The reduction in size of the semiconductor device can be attained.

4 Claims, 18 Drawing Sheets

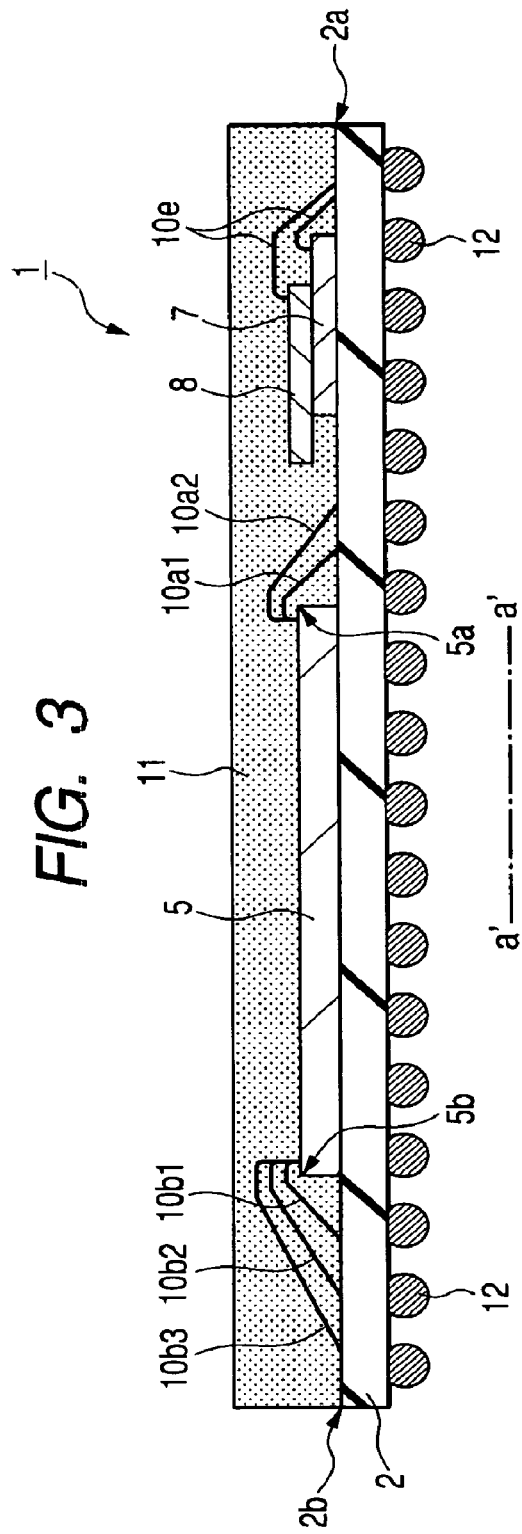
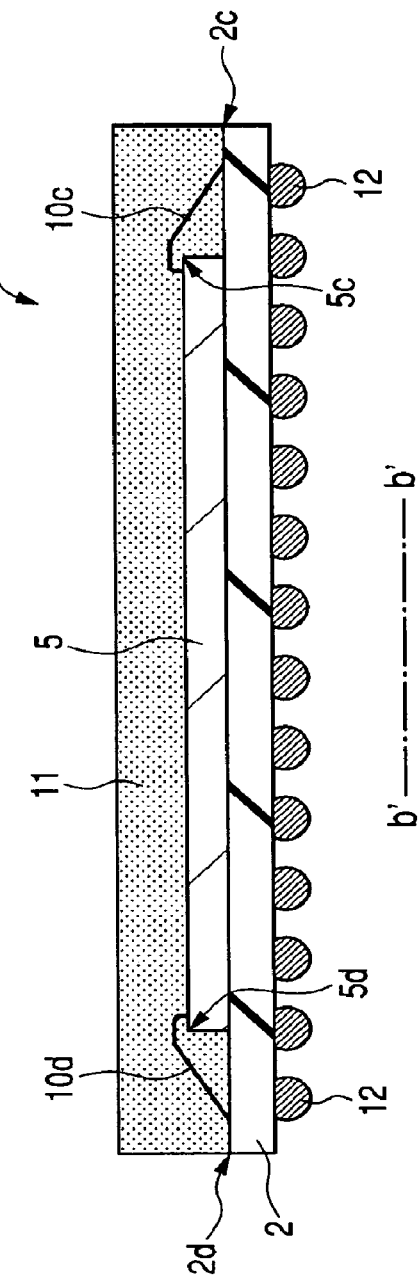

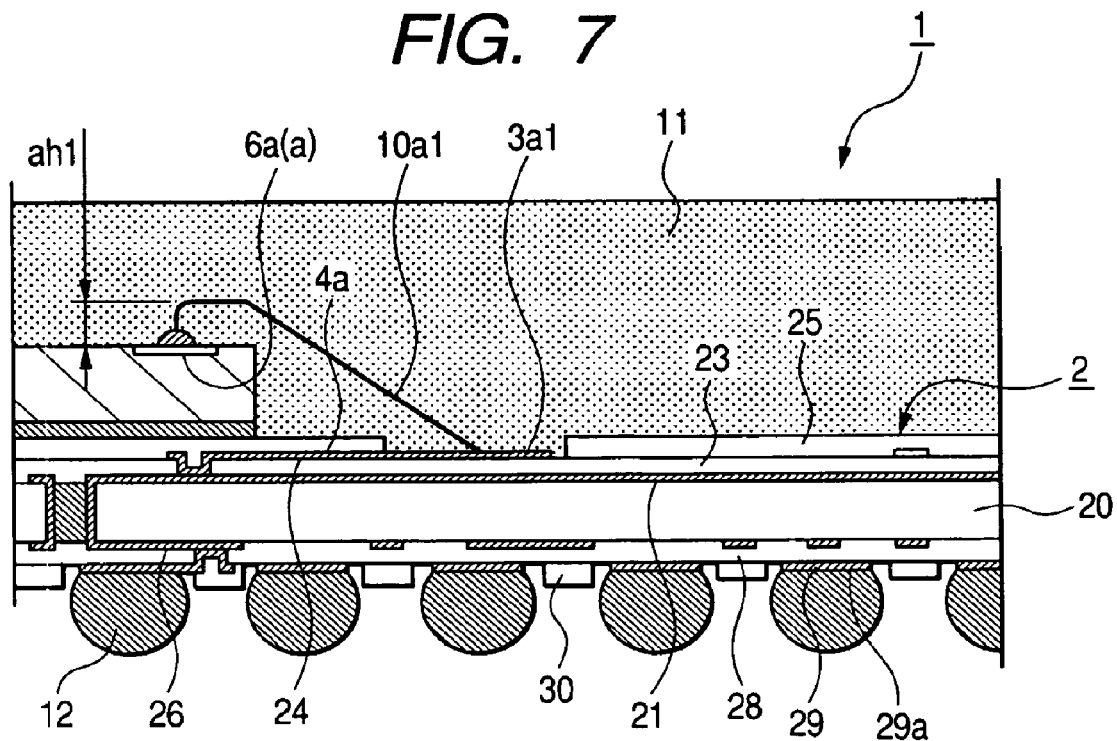
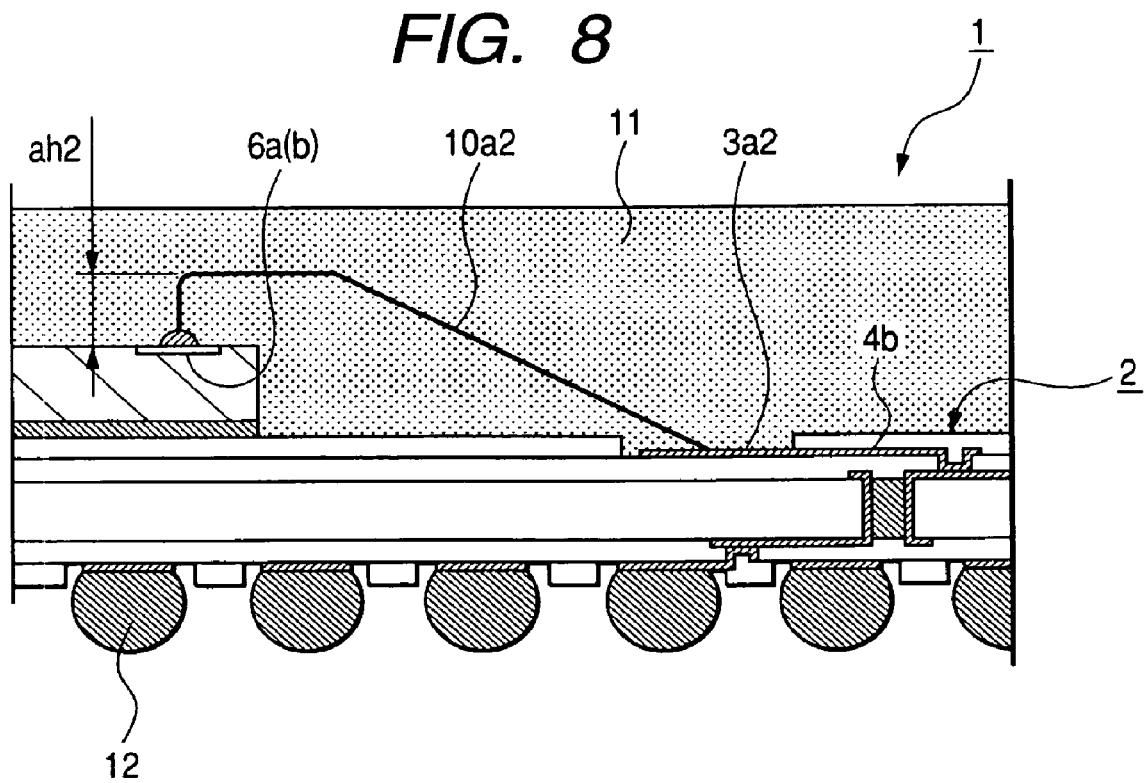

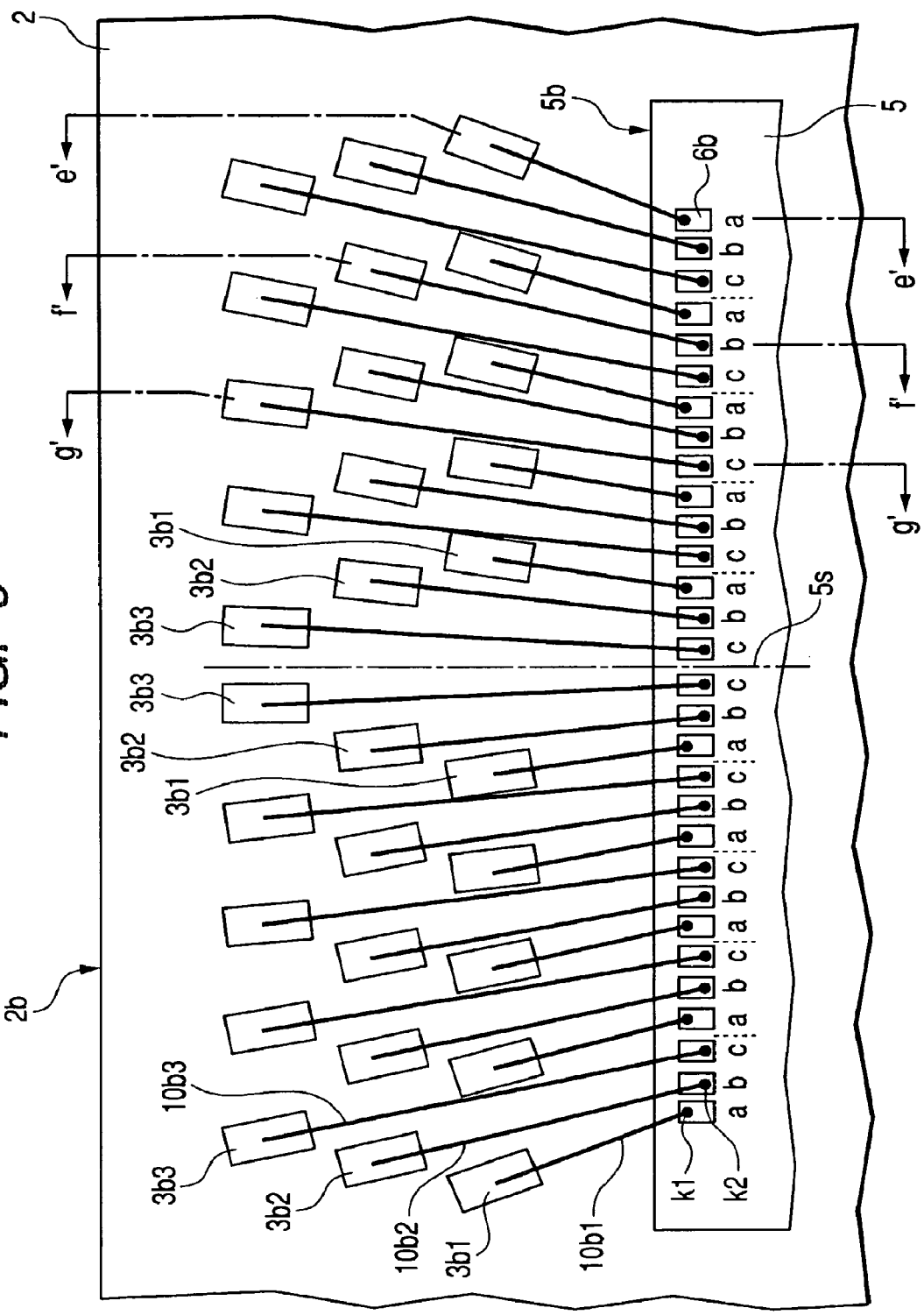

SEMICONDUCTOR DEVICE AND A MANUFACTURING METHOD OF THE SAME

CROSS-REFERENCE TO RELATED APPLICATION

This application is a division of application Ser. No. 11/520,816 filed Sep. 14, 2006 now U.S. Pat. No. 7,656,019. The present application also claims priority from Japanese patent application No. 2005-287775 filed on Sep. 30, 2005, the content of which is hereby incorporated by reference into this application.

BACKGROUND OF THE INVENTION

The present invention relates a semiconductor device and a manufacturing technique for the same. Particularly, the present invention is concerned with a technique applicable effectively to a semiconductor device wherein electrode pads of a semiconductor chip and electrode pads of a wiring board are connected together through bonding wires.

As a semiconductor device there is known, for example, a semiconductor device called BGA (Ball Grid Array) type. The BGA type semiconductor device is of a package structure wherein a semiconductor chip is mounted on a main surface side of a wiring board called interposer and plural ball-like solder bumps as external connecting terminals are arranged on a back surface side opposite to the main surface side.

BGA type semiconductor devices of various structures have been developed and commercialized, but are broadly classified into those of a face-up bonding structure (wire bonding structure) and those of a face-down bonding structure. In the face-up bonding structure, electrode pads arranged on a main surface (circuit-forming surface) of a semiconductor chip and electrode pads arranged on a main surface of a wiring board are electrically connected together through bonding wires. In the face-down bonding structure, electrode pads arranged on a main surface of a wiring board and electrode pads arranged on a main surface of a semiconductor chip are electrically connected together through salient electrodes (e.g., solder bumps or stud bumps) interposed between those electrode pads.

A BGA type semiconductor device of the face-up bonding structure is disclosed, for example, in Japanese Unexamined Patent Publication No. 2001-144214. A BGA type semiconductor device of the face-down bonding structure is disclosed, for example, in Japanese Unexamined Patent Publication No. Hei 6 (1994)-34983.

In connection with a wire bonding method wherein plural electrode pads arranged along one side of a main surface of a semiconductor chip and plural electrode pads arranged in two rows on a main surface of a wiring board and along one side of the semiconductor chip are electrically connected together through plural bonding wires, a technique for avoiding interference between pre-formed wires and a capillary is disclosed in Japanese Unexamined Patent Publication No. 2003-31610.

[Patent Literature 1]
Japanese Unexamined Patent Publication No. 2001-144214

[Patent Literature 2]
Japanese Unexamined Patent Publication No. Hei 6 (1994)-34983

[Patent Literature 3]
Japanese Unexamined Patent Publication No. 2003-31610

SUMMARY OF THE INVENTION

Recently, electronic devices such as portable telephones and portable personal computers have been becoming more and more small and BGA type semiconductor devices installed into those electronic device are also being required to be reduced in size. Having studied the reduction in size of a BGA type semiconductor device of the face-up bonding structure capable of being applied to existing manufacturing equipment and capable of being reduced in cost in comparison with the face-down structure, the present inventors found out the following problems.

For reducing the size of the BGA type semiconductor device it is necessary to reduce the planar size of a wiring board. For reducing the planar size of a wiring board it is necessary to narrow the layout pitch of electrode pads on the wiring board and shorten the length of a pad row consisting of plural electrode pads.

In the BGA type semiconductor device, plural electrode pads (bonding pads) arranged on a main surface of a semiconductor chip along one side of the main surface and plural electrode pads (connecting portions) arranged on a main surface of a wiring board correspondingly to the electrode pads arranged on the chip main surface are electrically connected together through plural bonding wires. In the conventional wiring board the plural electrode pads are arranged mainly in one row. In such a single-row layout of pads, however, it is impossible to satisfy required board size and wire length. For this reason, multi-row pads layouts such as two-row and three-row pads layouts are presently most popular.

In a multi-row pads layout, the length of each pads row is shorter than that in a single-row pads layout. However, the number of electrode pads tends to increase with an increase in the number of functions of an integrated circuit mounted on a semiconductor chip and an increase in the degree of integration. Therefore, for attaining the reduction in size of a semiconductor device, also in a multi-row pads layout, it is necessary to narrow the layout pitch of electrode pads and shorten the length of each pads row.

However, in a conventional multi-row pads layout, e.g., two-row pads layout, wires (wires drawn out from electrode pads) connected to the first row of electrode pads counted from the semiconductor chip side are extended while passing between the second row of electrode pads and therefore it is difficult to narrow the layout pitch of the second row of electrode pads.

As the pad row length becomes larger, it is necessary that the electrode pads on the wiring board be arranged away from the semiconductor chip, with the result that the length of bonding wires for electrically connecting the electrode pads on the semiconductor chip and the electrode pads on the wiring board with each other becomes larger. Besides, due to a difference in machining accuracy, the layout pitch of the electrode pads on the wiring board is wider than that of the electrode pads on the semiconductor chip, so that the length of bonding wires becomes larger gradually from the center of a side of the semiconductor chip toward ends thereof. However, as the pad row length of the wiring board becomes larger, the bonding wire length also becomes larger. Consequently, when forming a resin package in accordance with the transfer molding method, shorting of adjacent bonding wires is apt to occur due to deformation of the bonding wire shape caused by the flow of resin, i.e., wire deformation. This short-circuit contributes to a lowering of the semiconductor device manufacturing yield.

Further, since the layout pitch of the electrode pads on the wiring board is wider than that of the electrode pads on the semiconductor chip, the bonding wires extend radially from the semiconductor chip side at an acute angle relative to a phantom line extending across and perpendicularly to the center of one side of the semiconductor chip. However, as the pad row length on the wiring board becomes longer, the angle of the bonding wires relative to the phantom line becomes wider. Therefore, when connecting a bonding wire to one of two adjacent electrode pads on the semiconductor chip and thereafter connecting a bonding wire to the other electrode pad, there easily occurs interference of a capillary with the bonding wire connected to one electrode pad. This interference contributes to a lowering of the semiconductor device manufacturing yield.

It is an object of the present invention to provide a technique able to attain the reduction in size of a semiconductor device.

It is another object of the present invention to provide a technique able to improve the semiconductor device manufacturing yield.

The above and other objects and novel features of the present invention will become apparent from the following description and the accompanying drawings.

The following is an outline of typical modes of the present invention as disclosed herein.

(1) A semiconductor device comprising:
a semiconductor chip having a plurality of electrode pads formed over a main surface of the semiconductor chip along one side of the main surface;
a wiring board with the semiconductor chip mounted over a main surface thereof;
a plurality of first connecting portions formed over the main surface of the wiring board along the one side of the semiconductor chip;
a plurality of second connecting portions formed over the main surface of the wiring board along the one side of the semiconductor chip at a position more distant from the one side of the semiconductor chip than the first connecting portions;
a plurality of first wiring lines formed over the main surface of the wiring board and connected respectively to the first connecting portions;
a plurality of second wiring lines formed over the main surface of the wiring board and connected respectively to the second connecting portions;
a plurality of bonding wires for connecting the electrode pads respectively with the first and second connecting portions; and
a resin sealing body for sealing the semiconductor chip and the bonding wires,
wherein the first wiring lines extend from the first connecting portions toward the one side of the semiconductor chip, and the second wiring lines extend from the second connecting portions toward the side opposite to the one side of the semiconductor chip.

(2) In the above means (1), one end portions of the first wiring lines are connected respectively to the first connecting portions, and one end portions of the second wiring lines are connected respectively to the second connecting portions.

(3) In the above means (1), the layout pitch of the first connecting portions and that of the second connecting portions are twice as large as the layout pitch of the electrode pads.

(4) In the above means (1), the first and second connecting portions and the electrode pads are quadrangular in plan, one sides of the first connecting portions stand face to face with one sides of the corresponding electrode pads, and one sides of the second connecting portions stand face to face with one sides of the corresponding electrode pads.

(5) In the above means (1), the second connecting portions are each disposed between the two adjacent first connecting portions.

(6) In the above means (5), the second connecting portions are each disposed at a middle position of the layout pitch of the two adjacent first connecting portions.

(7) In the above means (1), the wiring board is of a multi-layer wiring structure having surface and inner wiring layers.

(8) In the above means (1), the wiring board is a build-up board of a multi-layer wiring structure having surface and inner wiring layers.

(9) In the above means (1), the wiring board is a semi-additive board of a multi-layer wiring structure having surface and inner wiring layers.

(10) A method of manufacturing a semiconductor device, comprising the steps of:

(a) providing a semiconductor chip, the semiconductor chip having a plurality of first electrode pads, a plurality of second electrode pads and a plurality of third electrode pads, the first, second and third electrode pads being formed in this order repeatedly over a main surface of the semiconductor chip and along one side of the main surface;

(b) providing a wiring board, the wiring board having a chip mounting portion for mounting the semiconductor chip thereover, a plurality of first connecting portions arranged outside the chip mounting portion along the one side of the semiconductor chip correspondingly to the first electrode pads, a plurality of second connecting portions arranged along the one side of the semiconductor chip at a position more distant from the one side of the semiconductor chip than the first connecting portions correspondingly to the second electrode pads, and a plurality of third connecting portions arranged along the one side of the semiconductor chip at a position more distant from the one side of the semiconductor chip than the second connecting portions correspondingly to the third electrode pads;

(c) mounting the semiconductor chip over the chip mounting portion of the wiring board in a state in which the first connecting portions are arranged along the one side of the semiconductor chip;

(d) connecting the first electrode pads and the first connecting portions electrically with each other through a plurality of first bonding wires;

(e) connecting the second electrode pads and the second connecting portions electrically with each other through a plurality of second bonding wires higher in loop height than the first bonding wires;

(f) connecting the third electrode pads and the third connecting portions electrically with each other through a plurality of third bonding wires higher in loop height than the second bonding wires; and (g) sealing the semiconductor chip and the first to third bonding wires with resin,
wherein the first to third bonding wires extend at an acute angle relative to a phantom line extending across the center of one side of the semiconductor chip perpendicularly to the one side of the semiconductor chip, the connection between the third bonding wires and the third electrode pads is performed at a position more distant from the one side of the semiconductor chip than the connection between the first bonding wires and the first electrode pads, and the steps (e), (d) and (f) are carried out in this order.

(11) In the above means (10), the connection between the second bonding wires and the second electrode pads is performed at a position shorter than the one side of the semiconductor chip than the connection between the third bonding wires and the third electrode pads.

(12) In the above means (10), the connection between the second bonding wires and the second electrode pads is performed at a position more distant from the one side of the semiconductor chip than the connection between the first bonding wires and the first electrode pads.

(13) In the above means (10), the first to third electrode pads each have a rectangular plane shape wherein two long sides positioned on mutually opposite sides extend in a direction away from the one side of the semiconductor chip.

The following is a brief description of effects obtained by the typical modes of the present invention as disclosed herein.

According to the present invention it is possible to attain the reduction in size of the semiconductor device.

According to the present invention it is possible to improve the semiconductor device manufacturing yield.

BRIEF DESCRIPTION OF THE DRAWINGS

FIG. 3 is a schematic sectional view taken on line a'-a' in FIG. 1;

FIG. 4 is a schematic sectional view taken on line b'-b' in FIG. 1;

FIG. 7 is a schematic sectional view taken on line c'-c' in FIG. 5;

FIG. 8 is a schematic sectional view taken on line d'-d' in FIG. 5;

FIG. 9 is a schematic plan view showing a part (portion B) of FIG. 1 in a simplified manner;

DETAILED DESCRIPTION OF PREFERRED EMBODIMENTS

Figure 1:
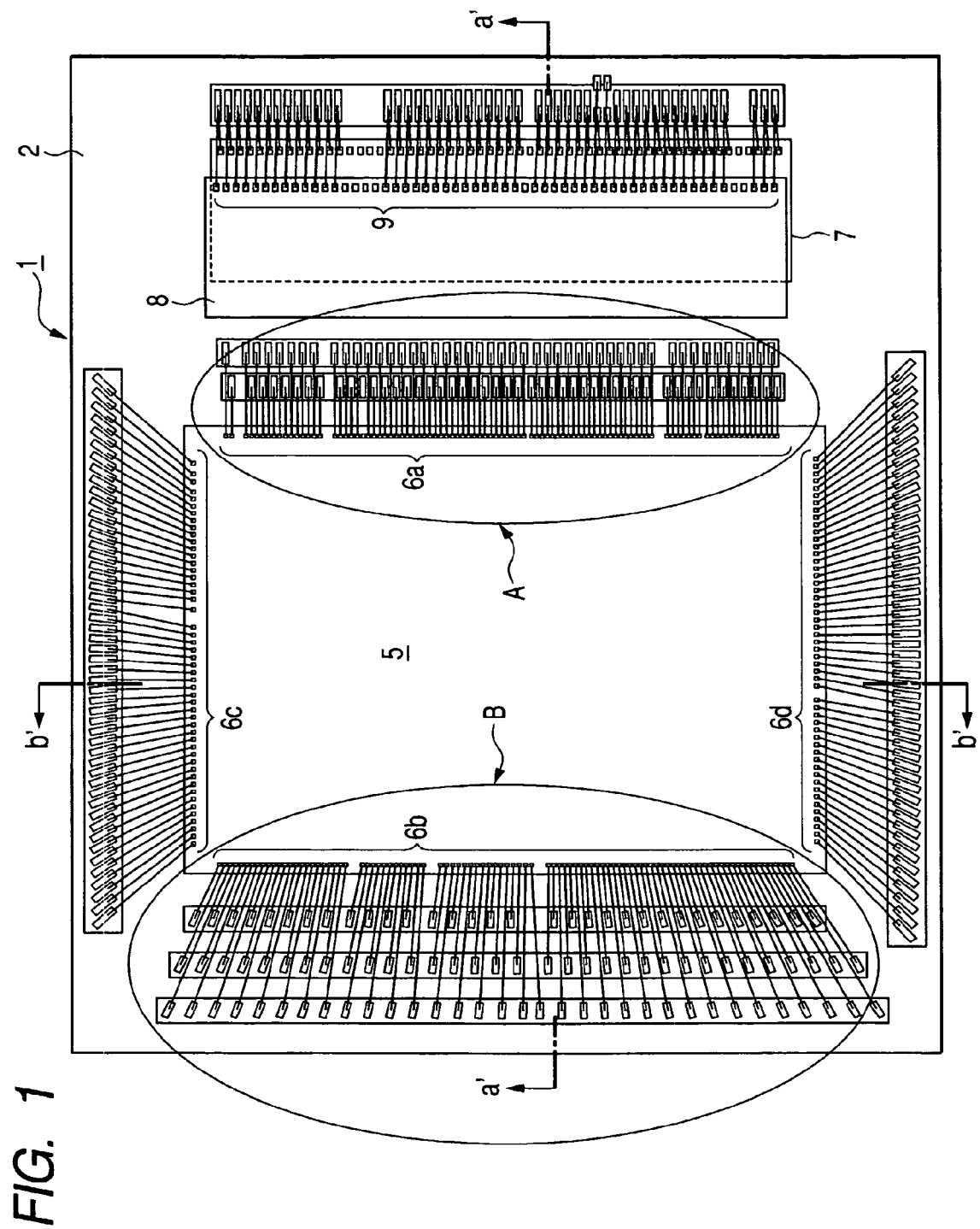
FIG. 1 is a schematic plan view showing an internal structure of a semiconductor device according to a first embodiment of the present invention.

Embodiments of the present invention will be described in detail hereinunder with reference to the accompanying drawings. In all of the drawings for illustrating the present invention, portions having the same functions are identified by the same reference numerals, and tautological explanations thereof will be omitted.

First Embodiment

In this first embodiment a description will be given below about an example of application of the present invention to an SIP (System In Package) type semiconductor device wherein plural semiconductor chips with integrated circuits of different functions formed thereon are mounted on a wiring substrate to build a single system.

Figure 2:
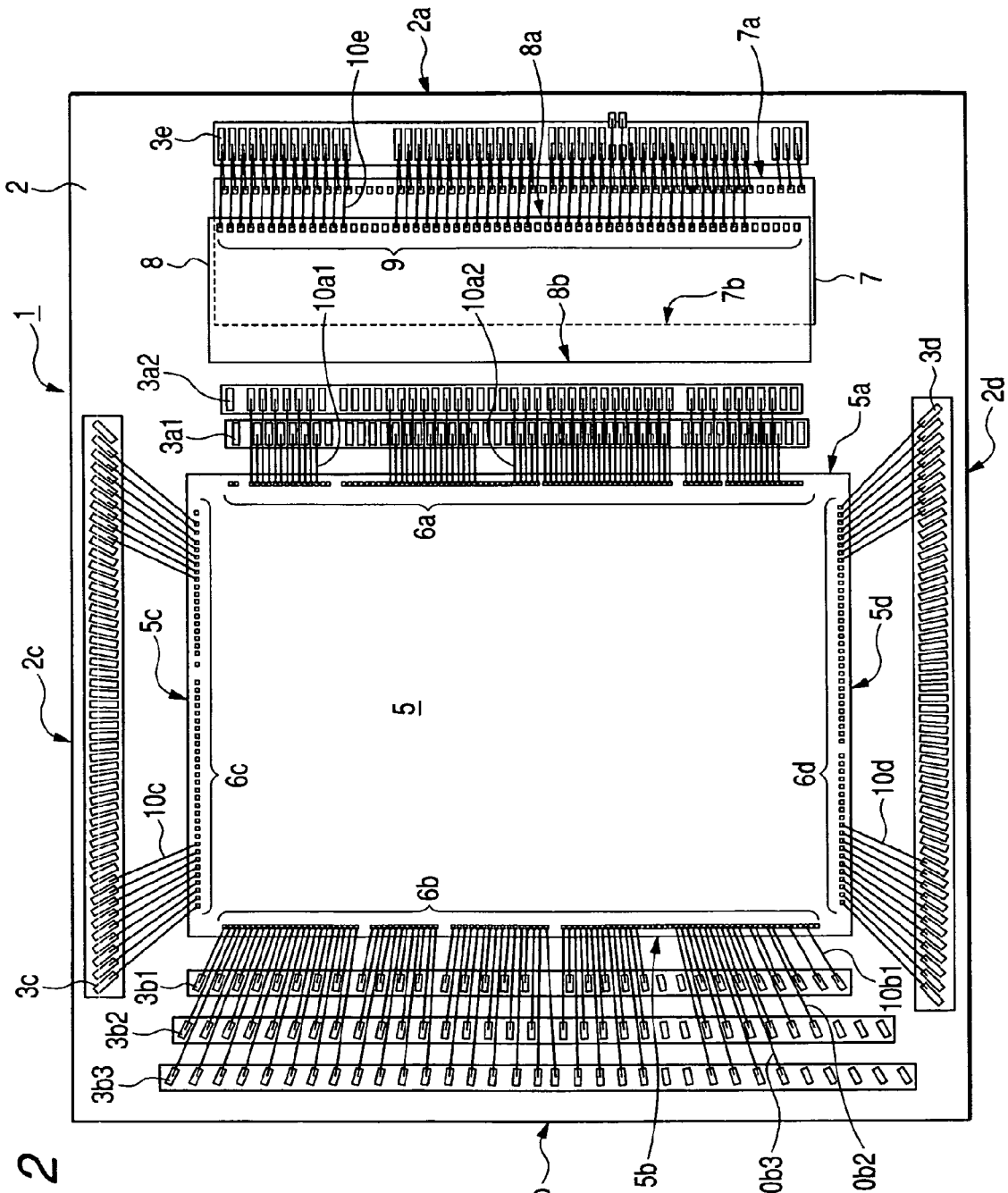
FIG. 2 is a schematic plan view showing a partially omitted state of bonding wires in FIG. 1.
Figure 5:
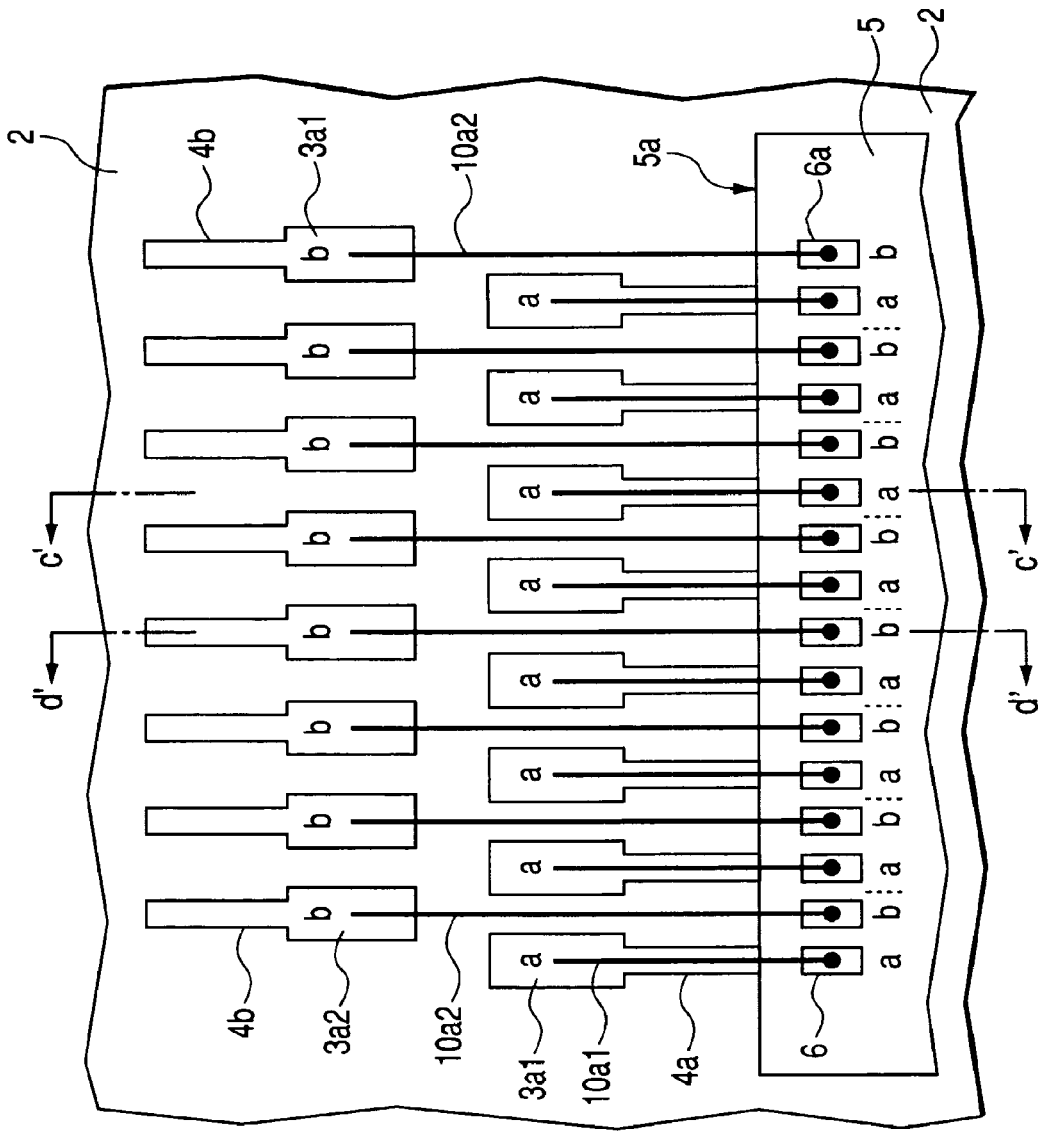
FIG. 5 is a schematic plan view showing a part (portion A) of FIG. 1 in a simplified manner.
Figure 6:
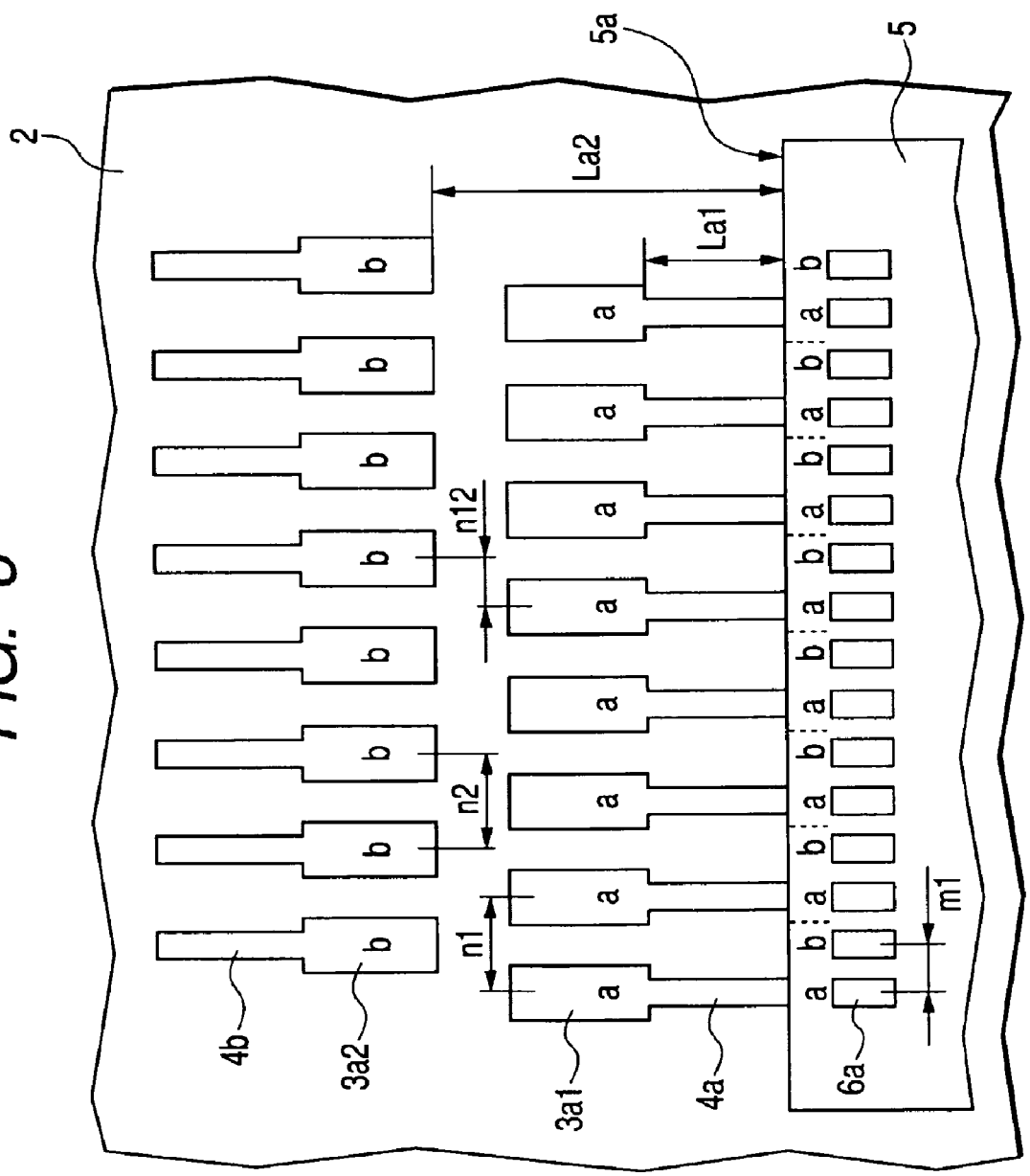
FIG. 6 is a schematic plan view showing a state in which bonding wires in FIG. 5 are omitted.
Figure 10:
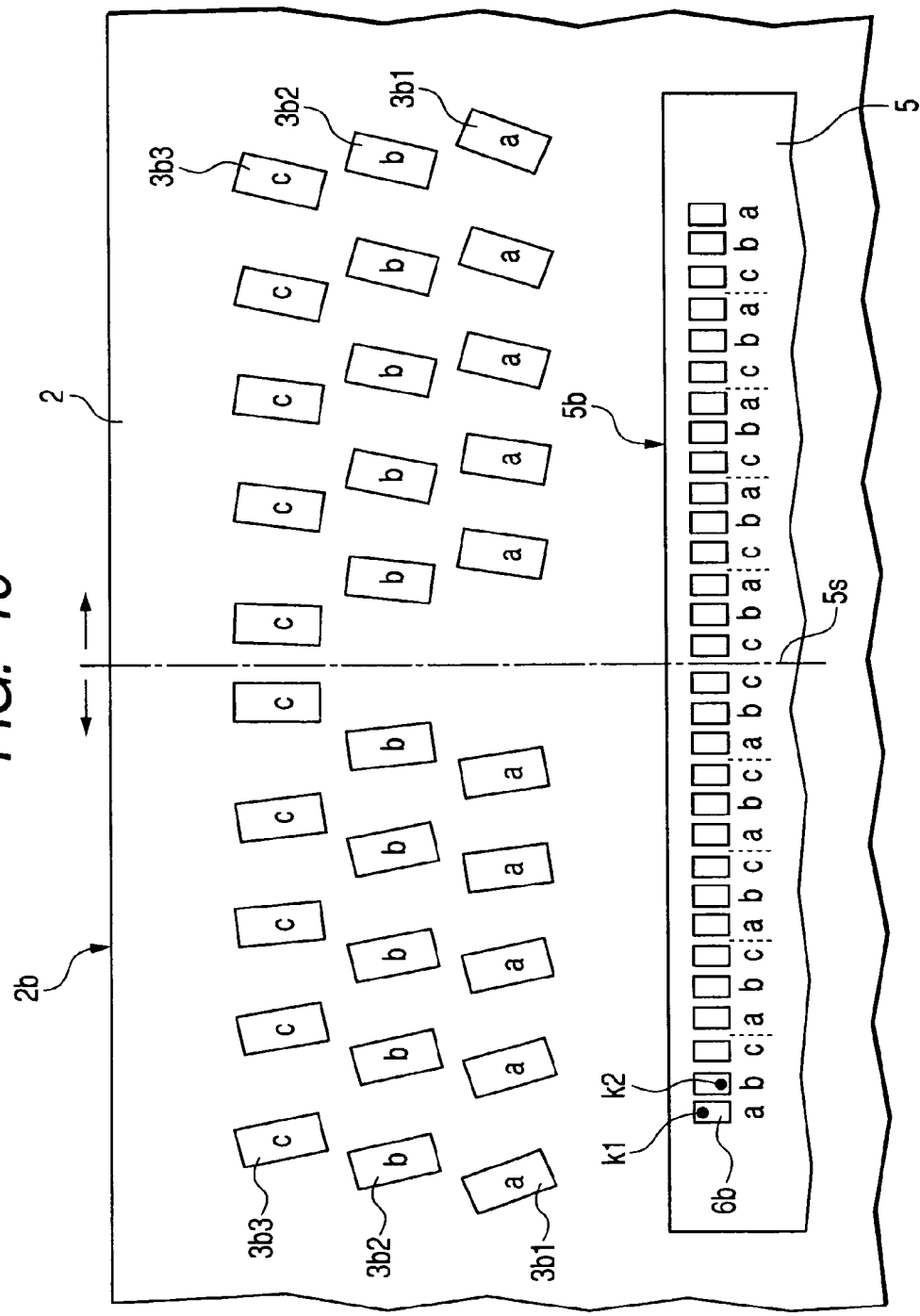
FIG. 10 is a schematic plan view showing a state in which bonding wires in FIG. 9 are omitted.
Figure 11:
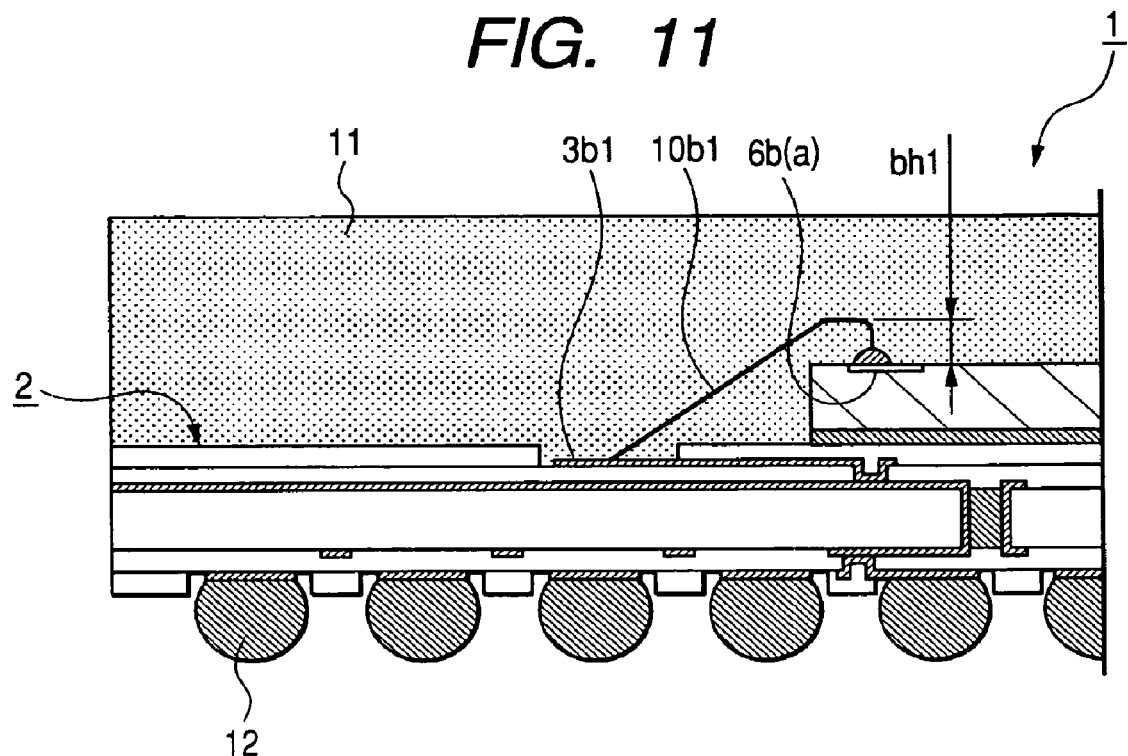
FIG. 11 is a schematic sectional view taken on line e'-e' in FIG. 9.
Figure 12:
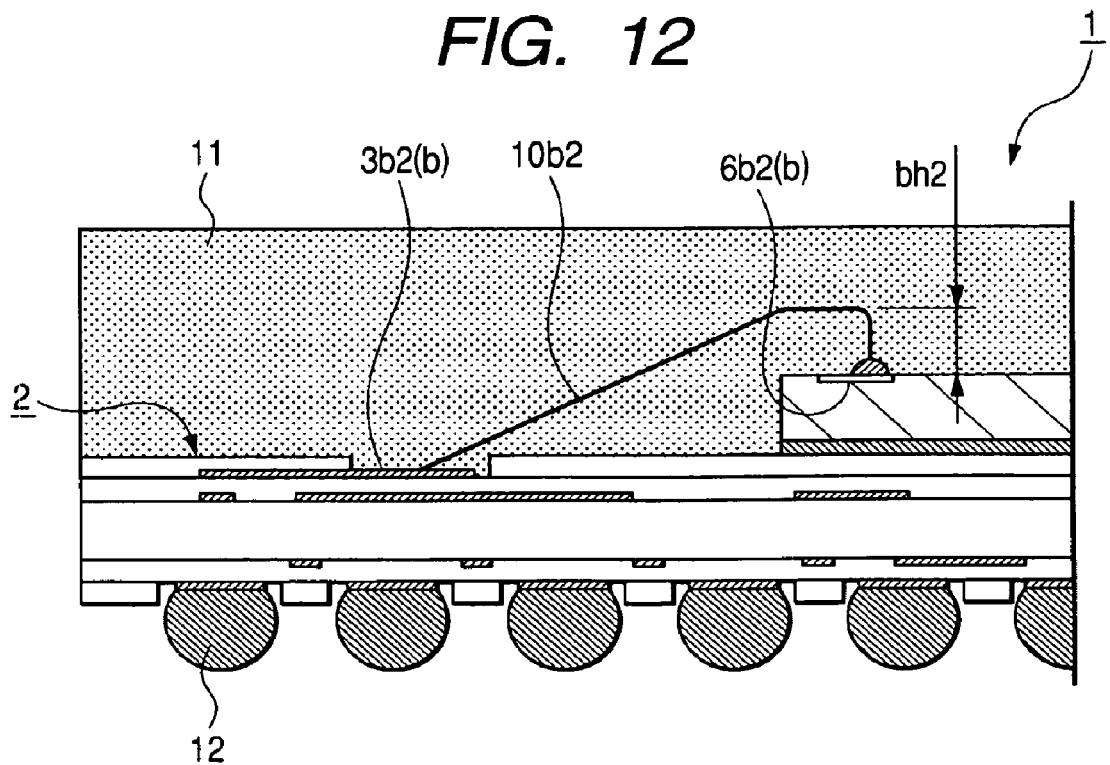
FIG. 12 is a schematic sectional view taken on line f'-f' in FIG. 9.
Figure 13:
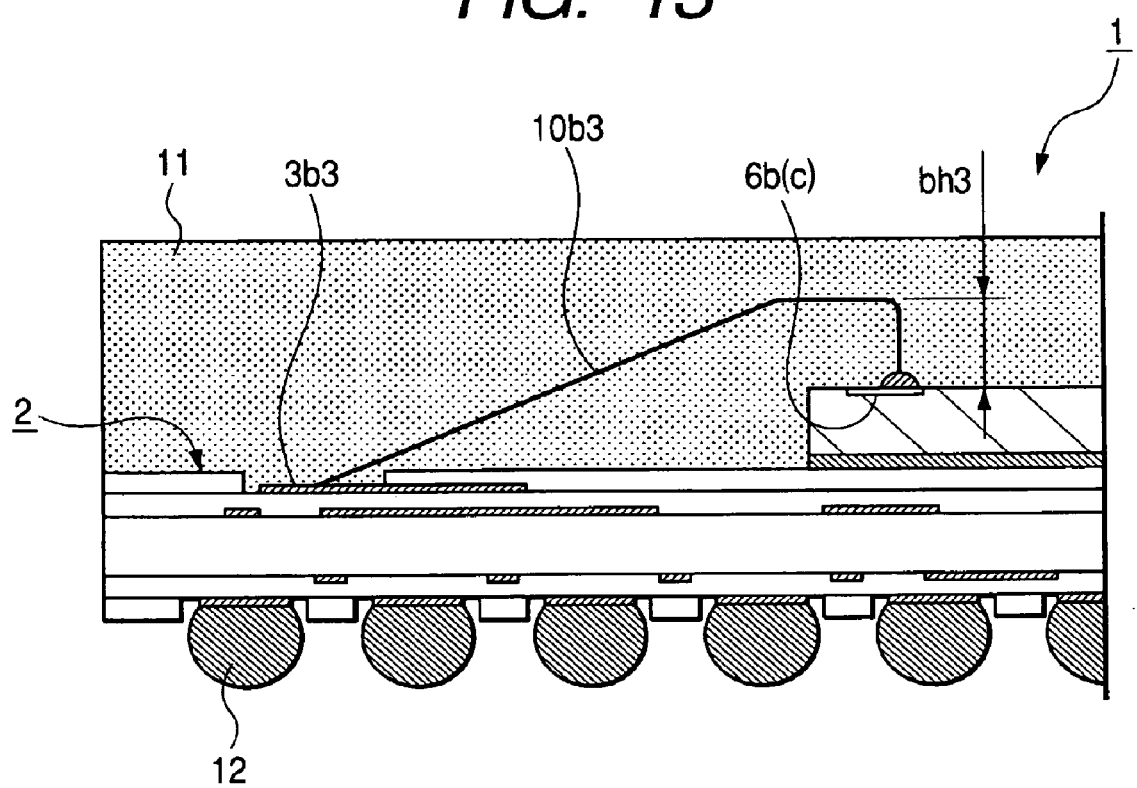
FIG. 13 is a schematic sectional view taken on line g'-g' in FIG. 9.

FIGS. 1 to 16 illustrate a semiconductor device according to a first embodiment of the present invention, of which FIG. 1 is a schematic plan view showing an internal structure of the semiconductor device, FIG. 2 is a schematic plan view showing a partially omitted state of bonding wires in FIG. 1, FIG. 3 is a schematic sectional view taken on line a'-a' in FIG. 1, FIG. 4 is a schematic sectional view taken on line b'-b' in FIG. 1, FIG. 5 is a schematic plan view showing a part (portion A) of FIG. 1 in a simplified manner, FIG. 6 is a schematic plan view showing an omitted state of bonding wires in FIG. 5, FIG. 7 is a schematic sectional view taken on line c'-c' in FIG. 5, FIG. 8 is a schematic sectional view taken on line d'-d' in FIG. 5, FIG. 9 is a schematic plan view showing a part (portion B) of FIG. 1 in a simplified manner, FIG. 10 is a schematic plan view showing an omitted state of bonding wires in FIG. 9, FIG. 11 is a schematic sectional view taken on line e'-e' in FIG. 9, FIG. 12 is a schematic sectional view taken on line f'-f' in FIG. 9, FIG. 13 is a schematic sectional view taken on line g'-g' in FIG. 9, and FIGS. 14 to 16 are schematic plan views showing a wire bonding process in the manufacture of the semiconductor device.

As shown in FIGS. 1 to 4, the semiconductor device, indicated at 1, of this first embodiment is of a package structure wherein one semiconductor chip 5 and two semiconductor chips (7, 8) are mounted on a main surface of a wiring board 2 which is also called an interposer, and plural, for example ball-like, solder bumps 12 as external connecting terminals are arranged on a back surface opposite to the main surface of the wiring board 2.

The semiconductor chip 5 and the semiconductor chips (7, 8) each have a quadrangular plane shape in a direction orthogonal to their thickness direction. In this embodiment, the semiconductor chip 5 has a rectangular shape of, for example, 5.0 mm×6.7 mm and the semiconductor chips (7, 8) each have a rectangular shape of, for example, 1.539 mm×6.137 mm. For example, the semiconductor chip 5 and the semiconductor chips (7, 8) each mainly comprise a semiconductor substrate, plural transistors formed on a main surface of the semiconductor substrate, further, on the main surface of the semiconductor substrate, an insulating layer, a multi-layer interconnection constituted by a stack of plural wiring layers, and a surface protecting film (final protecting film) formed so as to cover the multi-layer interconnection, although no limitation is made to this construction. The insulating layer is formed, for example, by a silicon oxide film. The wiring layers are each formed by a metallic film such as, for example, a film of aluminum (Al), aluminum alloy, copper (Cu), or copper alloy. The surface protecting film is formed by a multi-layer film as a stack of both inorganic and organic insulating films, including for example silicon oxide or silicon nitride film.

The semiconductor chip 5 has a main surface (elements-forming surface, circuit-forming surface) and a back surface which are positioned on mutually opposite sides. For example, a data processor (MPU: Micro Processing Unit) as an integrated circuit is formed on the main surface side of the semiconductor chip 5.

On the main surface of the semiconductor chip 5 are formed a first pad group consisting of plural electrode pads (bonding pads) 6a, a second pad group consisting of plural electrode pads (bonding pads) 6b, a third pad group consisting of plural electrode pads (bonding pads) 6c, and a fourth pad group consisting of plural electrode pads (bonding pads) 6d. The plural electrode pads 6a of the first pad group are arranged along a first side 5a of the semiconductor chip 5. The plural electrode pads 6b of the second pad group are arranged along a second side 5b which is positioned on the side opposite to the first side 5a. The plural electrode pads 6c of the third pad group are arranged along a third side 5c intersecting the first side 5a of the semiconductor chip 5. The plural electrode pads 6d of the fourth pad group are arranged along a fourth side 5d which is positioned on the side opposite to the third side 5c of the semiconductor chip 5. The plural electrode pads (6a to 6d) of the pad groups are formed on the top wiring layer in the multi-layer interconnection of the semiconductor chip 5 and are exposed from bonding apertures which are formed in the surface protecting film of the semiconductor chip 5 correspondingly to those electrode pads.

The semiconductor chips 7 and 8 each have a main surface (elements-forming surface, circuit-forming surface) and a back surface which are positioned on mutually opposite sides. For example, a synchronous DRAM (SDRAM: Synchronous Dynamic Random Access Memory) as an integrated circuit is formed on the main surface of each of the semiconductor chips 7 and 8. Plural electrode pads (bonding pads) 9 are formed on the main surface of each of the semiconductor chips 7 and 8 along a first side (7a, 8a) of the main surface.

The semiconductor chip 5 is bonded and fixed through an adhesive to the main surface of the wiring board 2 in a state in which its back surface confronts the main surface of the wiring board 2. The semiconductor chip 7 is bonded and fixed through an adhesive to the main surface of the wiring board 2 in a state in which a back surface thereof confronts the main surface of the wiring board 2. Further, the semiconductor chip 8 is bonded and fixed through an adhesive to a main surface of the semiconductor chip 7 in a state in which a back surface thereof confronts the main surface of the semiconductor chip 7.

The semiconductor chips 7 and 8 are stacked in plural stages in a positionally deviated state so that the electrode pads 9 of the semiconductor chip are positioned outside the first side 8a of the semiconductor chip 8. The semiconductor chips 7 and 8 are positioned away from the semiconductor chip 5 in such a manner that the extending direction of the respective first sides (7a, 8a) is the same as the extending direction of the first side 5a of the semiconductor chip 5 and that second sides (7b, 8b) thereof located on the side opposite to the first sides (7a, 8a) lie on the first-side 5a side.

A planar shape of the wiring board 2 in a direction intersecting its thickness direction is quadrangular. In this first embodiment it is a rectangular shape of, for example, 9 mm×11 mm. In the plane of the wiring board 2, one of two short sides positioned on mutually opposite sides is here designated a first side 2a and the other a second side 2b. Likewise, one of two long sides positioned on mutually opposite sides is here designated a third side 2c and the other a fourth side 2d.

The semiconductor chip 5 is disposed on the main surface of the wiring board 2 in a state in which the extending direction of its long sides (the first and second sides 5a, 5b) is the same as the extending direction of the two short sides (2a, 2b) of the wiring board 2.

On the main surface of the wiring board 2 are formed a pad group of plural electrode pads (connecting portions) 3a1, a pad group of plural electrode pads (connecting portions) 3a2, a pad group of plural electrode pads (connecting portions) 3b1, a pad group of plural electrode pads (connecting portions) 3b2, a pad group of plural electrode pads (connecting portions) 3b3, a pad group of plural electrode pads (connecting portions) 3c, a pad group of plural electrode pads (connecting portions) 3d, and a pad group of plural electrode pads (connecting portions) 3e.

The electrode pads 3a1 are disposed between the semiconductor chip 5 and the semiconductor chips (7, 8) outside and along the first side 5a of the semiconductor chip 5. The electrode pads 3a2 are disposed between the semiconductor chip 5 and the semiconductor chips (7, 8) at a position more distant from the first side 5a of the semiconductor chip 5 than the electrode pads 3a1 and along the first side 5a. That is, plural electrode pads (3a1, 3a2) are arranged in two rows between the semiconductor chip 5 and the semiconductor chips (7, 8) and along the first side 5a of the semiconductor chip 5.

The electrode pads 3b1 are disposed between the second side 5b of the semiconductor chip 5 and the second side 2b of the wiring board 2 outside and along the second side 5b of the semiconductor chip 5. The electrode pads 3b2 are disposed between the second side 5b of the semiconductor chip 5 and the second side 2b of the wiring board 2 at a position more distant from the second side 5b of the semiconductor chip 5 than the electrode pads 3b1 and along the second side 5b. The electrode pads 3b3 are disposed between the second side 5b of the semiconductor chip 5 and the second side 2b of the wiring board 2 at a position more distant from the second side 5b of the semiconductor chip 5 than the electrode pads 3b2 and along the second side 5b. That is, plural electrode pads (3b1, 3b2, 3b3) are arranged in three rows between the second side 5b of the semiconductor chip 5 and the second side 2b of the wiring board 2 and along the second side 5b of the semiconductor chip 5.

The electrode pads 3c are disposed between the third side 5c of the semiconductor chip 5 and the third side 2c of the wiring board 2 outside and along the third side 5c. That is, the plural electrode pads 3c are arranged in one row between the third side 5c of the semiconductor chip 5 and the third side 2c of the wiring board 2 and along the third side 5c.

The electrode pads 3d are disposed between the fourth side 5d of the semiconductor chip 5 and the fourth side 2d of the wiring board 2 outside and along the fourth side 5d. That is, the plural electrode pads 3d are arranged in one row between the fourth side 5d of the semiconductor chip 5 and the fourth side 2d of the wiring board 2 and along the fourth side 5d.

The plural electrode pads 3e are disposed between the first sides (7a, 8a) of the semiconductor chips (7, 8) and the first side 2a of the wiring board 2 outside and along the first sides (7a, 8a) of the semiconductor chips (7, 8). That is, the plural electrode pads 3e are arranged in one row between the first sides (7a, 8a) of the semiconductor chips (7, 8) and first side 2a of the wiring board 2 and along the first sides (7a, 8a).

The electrode pads 6a of the semiconductor chip 5 are electrically connected respectively to the electrode pads (3a1, 3a2) of the wiring board 2 through plural bonding wires (10a1, 10a2). The electrode pads 6b of the semiconductor chip 5 are electrically connected respectively to the electrode pads (3b1, 3b2, 3b3) of the wiring board 2 through plural bonding wires (10b1, 10b2, 10b3). The electrode pads 6c of the semiconductor chip 5 are electrically connected respectively to the electrode pads 3c of the wiring board 2 through plural bonding wires 10d. The electrode pads 6d of the semiconductor chip 5 are electrically connected respectively to the electrode pads 3d of the wiring board 2 through plural bonding wires 10d. The electrode pads 9 of the semiconductor chips (7, 8) are electrically connected respectively to the electrode pads 3e of the wiring board 2 through plural bonding wires 10e.

For example, gold (Au) wires are used as the bonding wires. As a bonding wire connecting method there is used, for example, a nail head bonding (ball bonding) method which uses ultrasonic vibration in combination with thermo-compression bonding. The connection of each bonding wire is performed by a normal bonding method wherein the electrode pads of the semiconductor chip 5 and the electrode pads of the wiring board 2 are connected as primary and secondary connections, respectively.

The semiconductor chip 5, the semiconductor chips (7, 8) and the bonding wires are sealed with a resin sealing body 11 formed on the main surface of the wiring board 2. For the purpose of diminishing stress, the resin sealing body 11 is formed using, for example, an epoxy-based thermosetting insulating resin containing a phenolic curing agent, silicone rubber and any of various fillers (e.g., silica)

A planar shape of the resin sealing body 11 in a direction intersecting its thickness direction is quadrangular. In this first embodiment, the planar size of the resin sealing body 1 is the same as that of the wiring board 2. For forming the resin sealing body 11 there is used, for example, a transfer molding method which is suitable for mass production.

In manufacturing the BGA type semiconductor device there is adopted an individual type transfer molding method which uses a multi-wiring board (matrix wiring board) having plural product-forming regions (device-forming regions, product-affording regions) partitioned by scribing lines and which seals semiconductor chips mounted on the product-forming regions with resin individually for each product-forming region, or there is adopted a transfer molding method of a block molding type which uses a multi-wiring board having plural product-forming regions and which seals semiconductor chips mounted on the product-forming regions all together with a single resin sealing body. The latter method is adopted in this first embodiment.

In the latter method, i.e., the transfer molding method of a block molding type, after the resin sealing body is formed, the multi-wiring board and the resin sealing body are divided into plural small pieces by dicing for example. Therefore, an outline size of the resin sealing body 11 and that of the wiring substrate 2 in this first embodiment are almost the same.

As shown in FIG. 7, plural electrode pads 29a are disposed on both main surface and opposite back surface of the wiring board 2. Solder bumps 12 are fixed (connected electrically and mechanically) to the electrode pads 29a respectively.

As shown in FIG. 7, the wiring board 2 is of a multi-layer wiring structure having surface and inner wiring layers. In this first embodiment, the wiring board 2 is of a four-layer wiring structure. The wiring board 2 includes a core member 20, a wiring layer 21 formed on a main surface of the core member 20, an insulating layer 23 formed on the main surface of the core member 20 so as to cover the wiring layer 21, a wiring layer 24 formed on the insulating layer 23, an insulating layer 25 formed on the insulating layer 23 so as to cover the wiring layer 24, a wiring layer 26 formed on both main surface and opposite back surface of the core member 20, an insulating layer 28 formed on the back surface of the core member 20 so as to cover the wiring layer 26, a wiring layer 29 formed on the insulating layer 28, and an insulating layer 30 formed on the insulating layer 28 so as to cover the wiring layer 29, although no limitation is made to this construction. The core member 20 is a highly elastic resin substrate constituted for example by glass fiber impregnated with epoxy resin or polyimide resin. The insulating layers 25 and 30 as surface layers are provided for the purpose of protecting wiring lines formed in the surface wiring layer and are formed for example by an insulating resin film (solder resist film).

The wiring substrate 2 is formed by a build-up method wherein insulating layers and wiring layers are formed one layer by one layer on the core member 20 and adjacent layers are connected to build up wiring layers into a multi-layer structure. In the wiring substrate, the wiring layers are formed by a semi-additive method.

The electrode pads (3a1, 3a2, 3b1 to 3b3, 3c, 3d, 3e) arranged on the main surface of the wiring board 2 are formed on the first wiring layer 24 counted from above of the multi-layer interconnection, while the electrode pads 29a arranged on the back side of the wiring substrate 2 are formed on the fourth wiring layer 29 counted from above of the multi-layer interconnection.

As shown in FIGS. 5 and 6, the plural electrode pads 6a of the semiconductor chip 5 are formed in a rectangular shape in plan and are arranged in such a manner that two long sides confronting each other extend in a direction away from the first side 5a of the semiconductor chip 5, in other words, two short sides stand face to face with the first side 5a of the semiconductor chip 5. The electrode pads 3a1 and 3a2 of the wiring board 2 are formed in a rectangular shape in plan and are arranged in such a manner that two long sides confronting each other extend in a direction away from the first side 5a of the semiconductor chip 5, in other words, two short sides stand face to face with the first side 5a of the semiconductor chip 5.

The electrode pads 6a of the semiconductor chip 5 which are electrically connected to the first row of electrode pads 3a1 through bonding wires 10a1 are identified by the reference mark "a," while the electrode pads 6b which are electrically connected to the second row of electrode pads 3a2 through bonding wires 10a2 are identified by the reference mark "b," to distinguish the two from each other. Also as to the electrode pads of the wiring board 2, the first row of electrode pads 3a1 corresponding to the electrode pads 6a (a) of the semiconductor chip 5 and the electrode pads 3a2 corresponding to the electrode pads 6a (b) of the semiconductor chip 5 are identified by the reference marks "a" and "b," respectively, to distinguish the two from each other.

The electrode pads 3a1 and 3a2 are arranged in a zigzag fashion alternately along the first side 5a of the semiconductor chip 5. The layout pitch n1 of the electrode pads 3a1 and the layout pitch n2 of the electrode pads 3a2 are each twice as large as the layout pitch m1 of the electrode pads 6a in terms of a design value. One sides (short sides) of the electrode pads 3a1 confront one sides (short sides) of corresponding electrode pads 6a. Likewise, one sides (short sides) of the electrode pads 3a2 confront one sides (short sides) of corresponding electrode pads 6a. The electrode pads 3a2 are each disposed between adjacent two electrode pads 3a1 and at a middle position of the layout pitch n2 of the electrode pads 3a1. That is, the electrode pads 3a1 and 3a2 are disposed in a layout such that the layout pitch n12 of the electrode pads 3a1 and 3a2 is equal (in terms of a design value) to the layout pitch m1 of the electrode pads 6a of the semiconductor chip 5. In this first embodiment, the layout pitch m1 of the electrode pads 6a is, for example, about 55 µm, the layout pitch n1 of the electrode pads 3a1 and the layout pitch n2 of the electrode pads 3a2 are, for example, about 110 µm, and the layout pitch n12 of the electrode pads 3a1 and 3a2 is, for example, about 55 µm.

The layout pitches of electrode pads are design values and it goes without saying that actual sizes somewhat differ depending on, for example, variations in the machining accuracy.

The bonding wires 10a1 for electrically connecting the electrode pads 6a and 3a1 with each other and the bonding wires 10a2 for electrically connecting the electrode pads 6a and 3a2 with each other extend substantially in parallel with each other and also in parallel with a phantom line which is orthogonal to the first side 5a of the semiconductor chip 5 across the middle of the first side 5a. A loop height (height from the bonding surface up to the longest portion of wire) ah2 of each bonding wire 10a2 is larger than a loop height ah1 of each bonding wire 10a1.

As shown in FIGS. 6 to 8, plural wiring lines 4a formed in the same wiring layer as that of the electrode pads 3a1 are connected respectively to the electrode pads 3a1. Likewise, wiring lines 4b formed in the same wiring layer as that of the electrode pads 3a2 are connected respectively to the electrode pads 3a2. One ends of the wiring lines 4a are integrally connected respectively to the electrode pads 3a1. Likewise, one ends of the wiring lines 4b are integrally connected respectively to the electrode pads 3a2. That is, the electrode pads 3a1 are formed by a part of the wiring lines 4a and the electrode pads 3a2 are formed by a part of the wiring lines 4b.

The wiring lines 4a extend respectively from the electrode pads 3a1 toward the one side 5a of the semiconductor chip 5. On the other hand, the wiring lines 5b extend respectively from the electrode pads 3a2 toward the side opposite to the one side 5a of the semiconductor chip 5.

As shown in FIGS. 9 and 10, the electrode pads 6b of the semiconductor chip 5 each have a rectangular plane shape and are arranged in such a manner that two long sides confronting each other extend in a direction away from the second side 5b of the semiconductor chip 5, in other words, two short sides confront the second side of the semiconductor chip 5. The electrode pads 3b1 to 3b3 of the wiring board 2 each have a rectangular shape in plan and are arranged in such a manner that two long sides confronting each other extend in a somewhat deviated state with respect to the direction away from the first side 5a of the semiconductor chip, in other words, two short sides are somewhat oblique relative to the second side 5b of the semiconductor chip 5.

The third row of electrode pads 3b3, the second row of electrode pads 3b2, and the first row of electrode pads 3b1, are arranged in a state in which, with respect to the electrode pads positioned in the same stage number (order) counted from a phantom line (center line) 5s which is orthogonal to the second side 5b of the semiconductor chip 5 across the center of the second side 5b, the electrode pad 3b2 in the second row is more distant from the phantom line 5s than the electrode pad 3b3 in the third row, and the electrode pad 3b1 in the first row is more distant from the phantom line 5s than the electrode pad 3b2 in the second row.

In connection with the electrode pads 6b of the semiconductor chip 5, for the purpose of distinction, the electrode pads 6b connected electrically to the first row of electrode pads 3b1 of the wiring board 2 through the bonding wires 10b1 are identified by the reference mark "a," the electrode pads 6b connected electrically to the second row of electrode pads 3b2 of the wiring board 2 through the bonding wires 10b2 are identified by the reference mark "b," and the electrode pads 6b connected electrically to the third row of electrode pads 3b3 of the wiring board 2 through the bonding wires 10b3 are identified by the reference mark "c."

In connection with the electrode pads of the wiring board 2, the first row of electrode pads 3b1 corresponding to the electrode pads 6b (a) of the semiconductor chip 5, the electrode pads 3b2 corresponding to the electrode pads 6b (b) of the semiconductor chip 5, and the electrode pads 3b3 corresponding to the electrode pads 6b (c) of the semiconductor chip 5, are identified by the reference marks "a," "b," and "c," respectively.

As to the electrode pads 6b, the electrode pads "c," "b," and "a," are arranged in this order repeatedly from the center of the second side 5b of the semiconductor chip 5 toward end portions of the second side 5b and along the second side. That is, the bonding wires 10b3 for connecting the electrode pads 6b (c) of the semiconductor chip 5 with the third row of electrode pads 3b3 of the wiring board 2, the bonding wires 10b2 for connecting the electrode pads 6b (b) of the semiconductor chip 5 with the second row of electrode pads 3b2 of the wiring board 2, and the bonding wires 10b1 for connecting the electrode pads 6b (a) of the semiconductor chip 5 with the first row of electrode pads 3b1 of the wiring board 2, are arranged in this order repeatedly from the center of the second side 5b of the semiconductor chip 5 toward end portions of the second side.

The bonding wires 10b1 to 10b3 extend radially from the semiconductor chip 5, starting from the center of the second side 5b of the semiconductor chip 5, at an acute angle relative to the phantom line 5s.

As shown in FIG. 9 and FIGS. 11 to 13, the connection between the bonding wires 10b3 and the electrode pads 6b (c) of the semiconductor chip 5 is performed at a position more distant from the second side 5b of the semiconductor chip 5 than the connection between the bonding wires 10b1 and the electrode pads 6b (a) of the semiconductor chip 5. The connection between the bonding wires 10b2 and the electrode pads 6b (b) of the semiconductor chip 5 is performed at a position more distant from the second side 5b of the semiconductor chip 5 than the connection between the bonding wires 10b1 and the electrode pads 6b (a). As shown in FIGS. 11 to 13, a loop height bh2 (see FIG. 12) of each bonding wire 10b2 is larger than a loop height bh1 (see FIG. 11) of each bonding wire 10b1. A loop height bh3 (see FIG. 13) of each bonding wire 10b3 is larger than the loop height bh2 (see FIG. 12) of each bonding wire 10b2.

The following description is now provided about manufacturing the semiconductor device 1.

First, the semiconductor chip 5 and the two semiconductor chips (7, 8) are provided and the multi-wiring board is also provided.

Next, the semiconductor chip 5 and the semiconductor chips 7, 8 are mounted on the chip mounting portion of each product-forming region of the multi-wiring board. The mounting of the semiconductor chips is performed in a state in which pad rows in each product-forming region extend along sides of the semiconductor chips.

Next, in each product-forming region, the electrode pads of the semiconductor chip and the electrode pads arranged around the semiconductor chips are electrically connected through bonding wires. As a result, the semiconductor chip 5 and the semiconductor chips 7, 8 are mounted in each product-forming region of the multi-wiring substrate.

By the term "mounting" is meant a state in which the semiconductor chips are bonded and fixed to the substrate and connecting pads of the substrate and connecting pads of the semiconductor chips are electrically connected with each other. In this first embodiment, the bonding and fixing are effected using an adhesive, and the electric connection between the electrode pads of the multi-wiring board and the electrode pads of the semiconductor chips is effected using bonding wires.

Next, using the transfer molding method of a block molding type, the semiconductor chips mounted in the product-forming regions 37 of the multi-wiring board are together sealed with resin to form a resin sealing body.

Next, plural solder bumps 12 are formed on both main surface and opposite back surface of the multi-wiring board correspondingly to the product-forming regions. The solder bumps 12 are formed, for example, by applying flux onto the electrode pads formed on the back surface of the multi-wiring board, thereafter supplying solder balls onto the electrode pads 32 and subsequently melting the solder balls to effect bonding with the electrode pads.

Next, the flux used in the solder bump forming process is removed by washing and thereafter identification marks such as product name, company name, type of product, and manufacturing lot number, are formed on the upper surface of the resin sealing body in accordance with, for example, ink jet marking method, direct printing method, or laser marking method, correspondingly to the product-forming regions 37 of the multi-wiring board.

Next, the multi-wiring board and the resin sealing body are divided into plural small pieces correspondingly to the product-forming regions. This dividing work is performed, for example, by dicing the multi-wiring board and the resin sealing body along scribing lines on the multi-wiring board by means of a dicing blade in a state in which the resin sealing body is affixed to a dicing sheet. In this dicing process the semiconductor device 1 shown in FIG. 1 is nearly completed.

Next, a description will be given below about wire bonding for electrically connecting the electrode pads 6b arranged on the main surface of the semiconductor chip 5 along the first side 5b of the main surface with the electrode pads (3b1, 3b2, 3b3) which are arranged in three rows on the main surface of the wiring board 2 correspondingly to the electrode pads 6b, using plural bonding wires (10b1, 10b2, 10b3).

Figure 14:
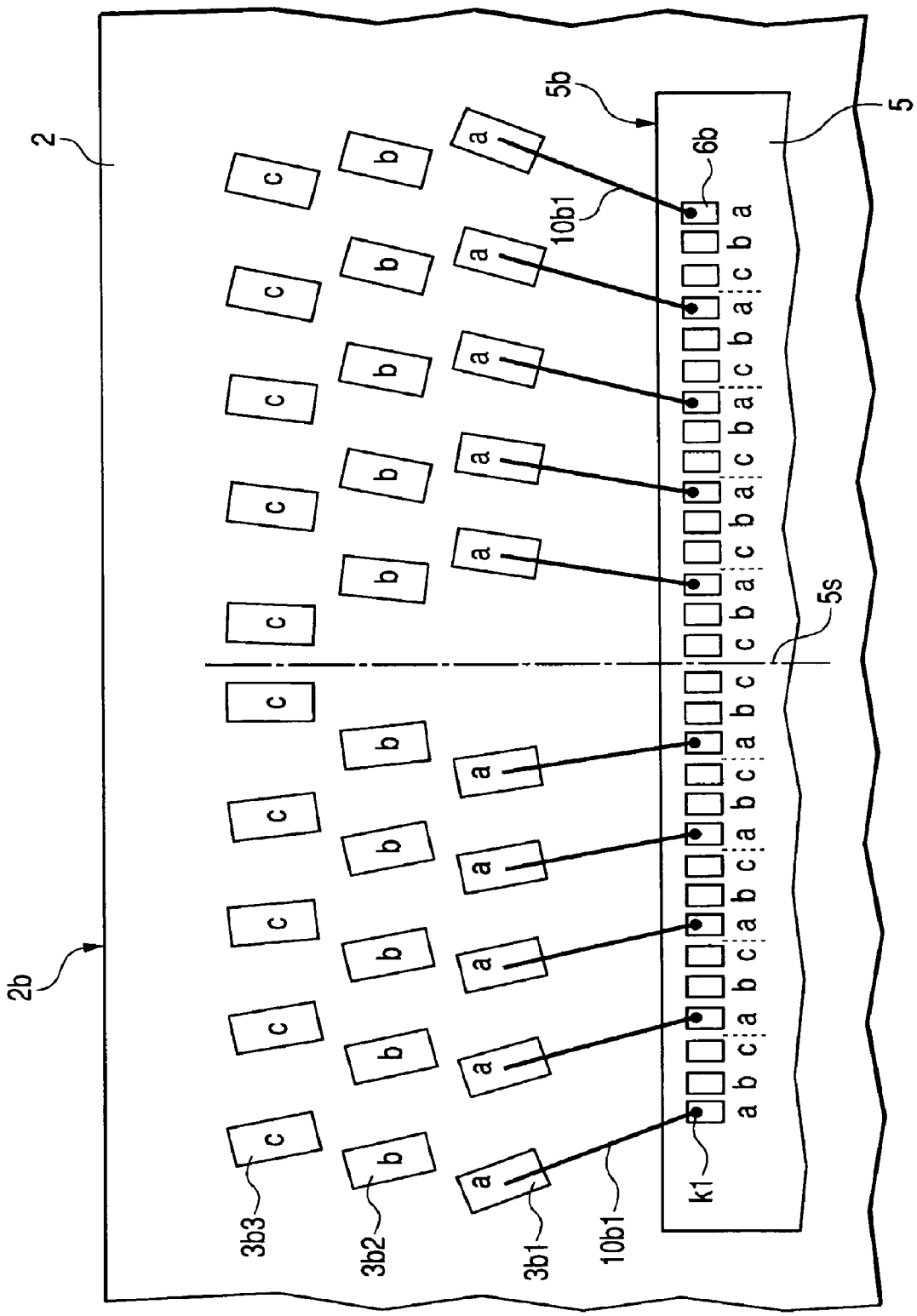
FIG. 14 is a schematic plan view showing a wire bonding process in the manufacture of the semiconductor device of the first embodiment.

First, as shown in FIG. 14, the first row of electrode pads 3b1 (a) arranged on the wiring board 2 and, out of the electrode pads 6b of the semiconductor chip 5, the electrode pads 6b (a) corresponding to the first row of electrode pads 3b1 of the wiring board 1 are electrically connected together through bonding wires 10b1. In this process, the connection between the bonding wires 10b1 and the electrode pads 6b (a) is performed at a position (connection point k1) offset to the short side closer to the second side 5b of the semiconductor chip 5 out of the two short sides of the electrode pads (a). The bonding wires 10b1 extend at an acute angle relative to the phantom line 5s.

Figure 15:
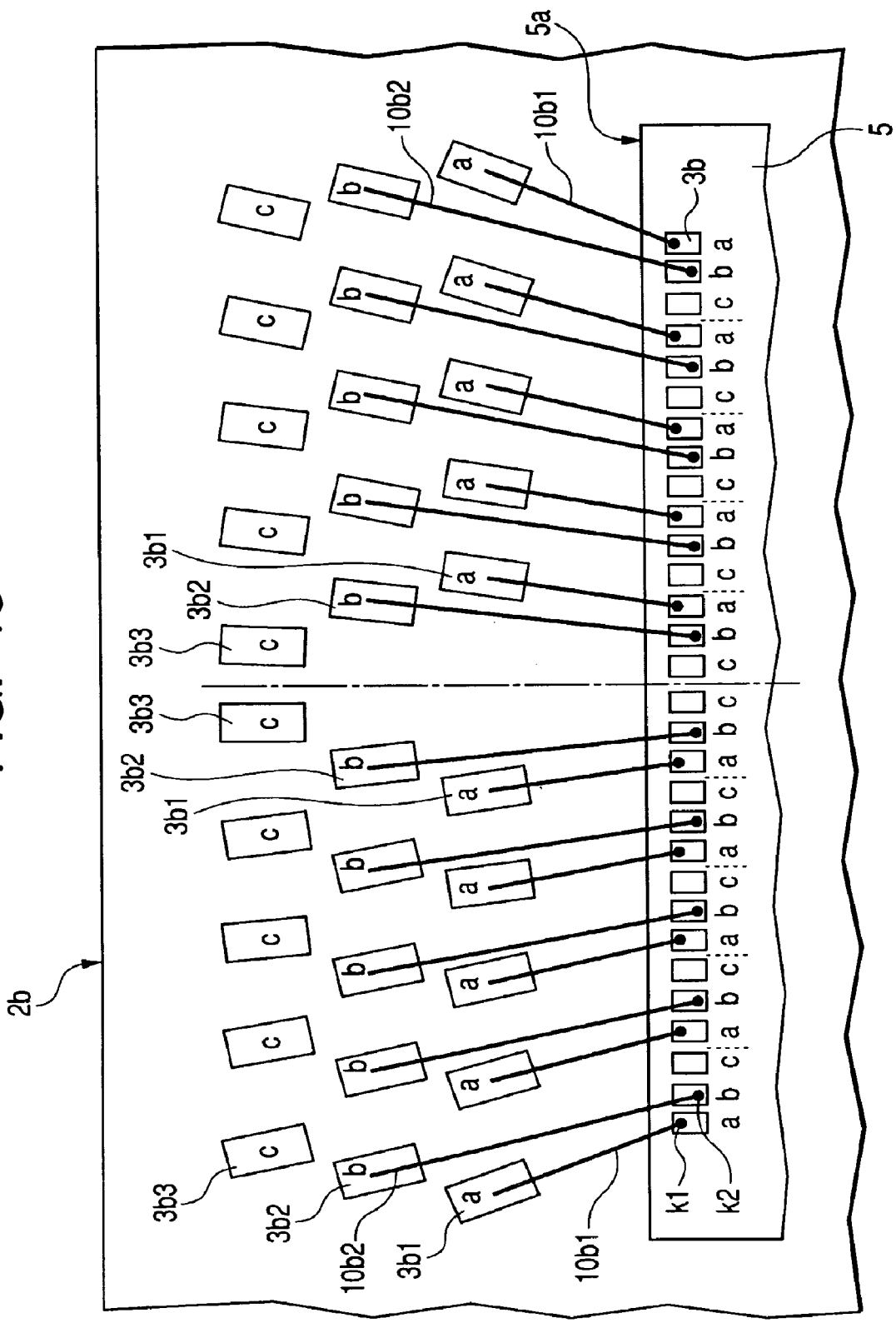
FIG. 15 is a schematic plan view showing the wire bonding process.

Next, as shown in FIG. 15, the second row of electrode pads 3b2 (b) arranged on the wiring board 2 and, out of the electrode pads 6b of the semiconductor chip 5, the electrode pads 6b (b) corresponding to the second row of electrode pads 3b2 of the wiring board 2 are electrically connected together through bonding wires 10b2. The connection between the bonding wires 10b2 and the electrode pads 6b (b) is performed at a position (connection point k2) offset to the short side distant from the second side 5b of the semiconductor chip 5 out of the two short sides of the electrode pads 6b (b). In other words, the connection of the bonding wires 10b2 is performed at a position offset to the short side different from the short side of the electrode pads 6b (a) to which the bonding wires 10b1 are connected. The bonding wires 10b2 extend at an acute angle relative to the phantom line 5s. In this process, the connecting position (connection point k2) of the bonding wire 10b2 in any electrode pad 6b (b) and the connecting position (connection point k1) of the bonding wire 10b1 in the electrode pad 6b (a) adjacent thereto are offset to different short sides respectively. In other words, the connection points are connected in a zigzag relation to the bonding wires, so when a capillary comes down to any electrode pad 6b (b), the distance between the associated bonding wire 10b1 and the capillary becomes larger than the layout pitch of the electrode pads 6b, so that it is possible to prevent interference between the bonding wire 10b1 and the capillary.

Figure 16:
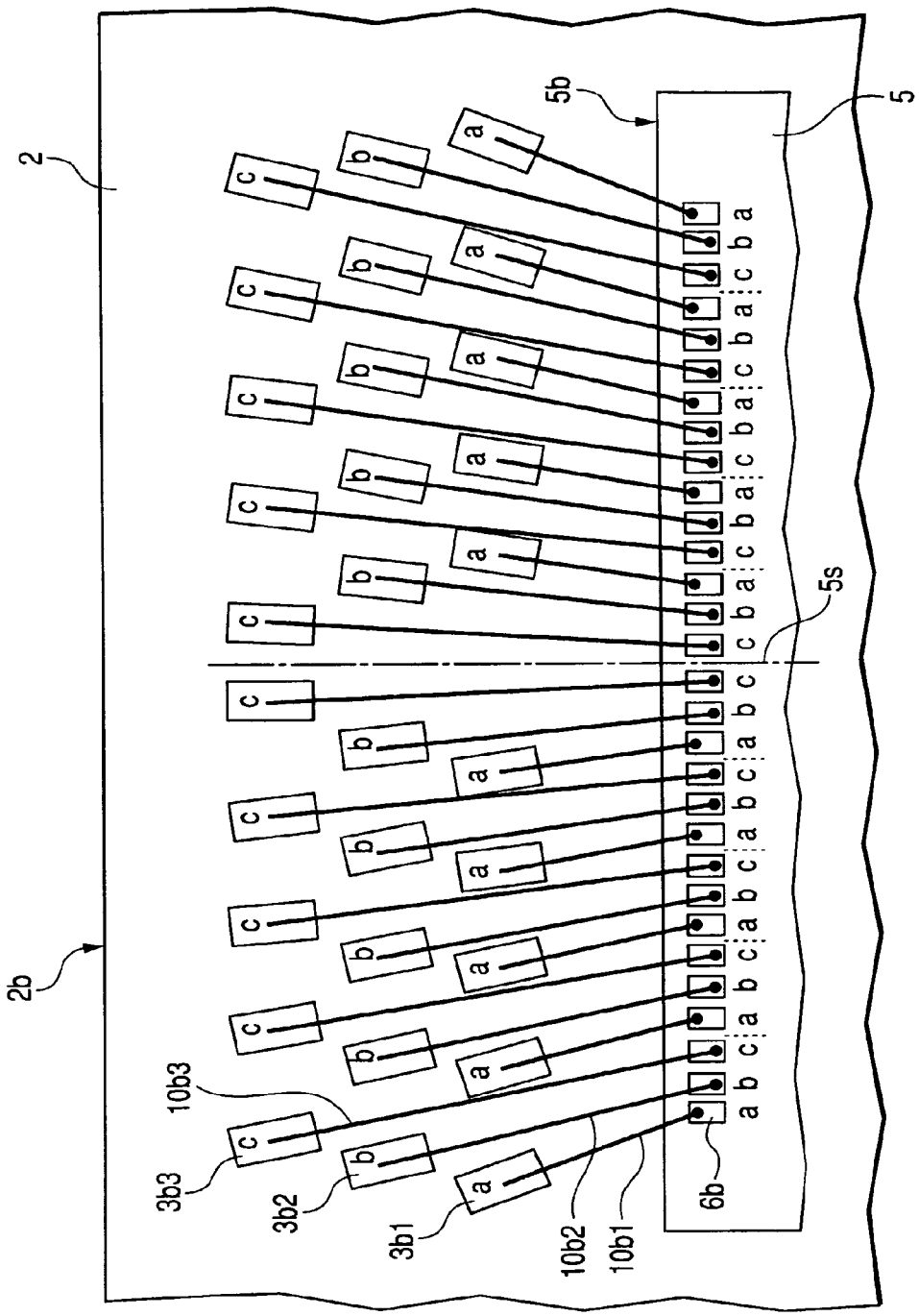
FIG. 16 is a schematic plan view showing the wire bonding process.

Next, as shown in FIG. 16, the third row of electrode pads 3b3 arranged on the wiring board 2 and, out of the electrode pads 6b of the semiconductor chip 5, the electrode pads 6b (c) corresponding to the third row of electrode pads 3b3 are electrically connected together through bonding wires 10b3. The connection between the bonding wires 10b3 and the electrode pads 6b (c) is performed at a position (connection point k2) offset to the short side distant from the second side 5b of the semiconductor chip 5 out of the two short sides of the electrode pads (c). In other words, the connection is performed at a position offset to the short side of each electrode pad 6b (b) located on the same side as the short side to which the associated bonding wire 10b is connected. The bonding wires 10b2 extend at an acute angle relative to the phantom line 5s.

In this process, the bonding wire 10b2 connected to the electrode pad 6b (b) adjacent to any electrode pad 6b (c) extends at an acute angle relative to the phantom line 5s, that is, it faces the outside with respect to the electrode pad 6b (c). Therefore, when the capillary comes down to the electrode pad 6b (c), the distance between the bonding wire 10b2 and the capillary becomes larger than the layout pitch of the electrode pads 6b, whereby it is possible to prevent interference between the bonding wire 10b1 and the capillary. On the other hand, the bonding wire 10b1 connected to the electrode pad 6b (a) adjacent to any electrode pad 6b (c) extends at an acute angle relative to the phantom line 5s, that is, it faces the inside with respect to the electrode pad 6b (c). However, since the connection between the bonding wires 10b3 and the electrode pads 6b (c) is performed at a position distant from the second side 5b of the semiconductor chip 5 with respect to the connecting position between the bonding wires 10b1 and the electrode pads 3b1, when the capillary comes down to the electrode pad 6b (c) concerned, the distance between the associated bonding wire 10b1 and the capillary becomes larger than the layout pitch of the electrode pads 6b. Thus, it is possible to prevent interference between the bonding wire 10b1 and the capillary.

In the case where the electrode pads of the wiring board 2 are arranged in multiple rows as in this first embodiment, the bonding wires 10b1 connected to the first row of electrode pads 3b1, the bonding wires 10b2 connected to the second row of electrode pads 3b2, and the bonding wires 10b3 connected to the third row of electrode pads 3b3, are different in wire length. In such a wire bonding process using wires of different lengths, it is necessary to change the loop heights of bonding wires in order to prevent the occurrence of a wire touch defect such as contact of a bonding wire with a semiconductor chip or contact of adjacent wires which defect is caused by, for example, wire sagging (an intermediately sagging state of a wire loop) or wire crooking (a crooked, not linear, state of a two-point connecting wire when seen from above). In this first embodiment, the loop height bh2 (see FIG. 12) of the bonding wires 10b2 connected to the second row of electrode pads 3b2 is larger than the loop height bh1 (see FIG. 11) of the bonding wires 10b1 connected to the first row of electrode pads 3b1, and the loop height bh3 (see FIG. 13) of the bonding wires 10b3 connected to the third row of electrode pads 3b3 is larger than the loop height bh2 (see FIG. 12) of the bonding wires 10b2 connected to the second row of electrode pads 3b2.

If the bonding wire loop height is not taken into account, the bonding wire-capillary interference can be suppressed by performing wire bonding successively from both ends of the second side 5b of the semiconductor chip 5 toward the center of the second side. However, if the bonding wire loop height is taken into account and if wire bonding is performed from end portions of the second side 5b of the semiconductor chip 5 toward the center of the second side, connection is made using the bonding wires 10b1 of a small loop height after connection using the bonding wires 10b3 of a large loop height. Consequently, the capillary which is going to perform subsequent wire bonding interferes with a bonding wire 10b3 of a large loop height.

Therefore, as in this first embodiment, it is effective to perform wire connection of the second row of electrode pads 3b2 after wire connection of the first row of electrode pads 3b1 and perform wire connection of the third row of electrode pads 3b3 after wire connection of the second row of electrode pads 3b2. In other words, it is effective to perform wire connection using wires of a certain length and, after the completion thereof, perform wire connection using wires of a different length.

In this first embodiment, as shown in FIGS. 5 to 8, the wiring lines 4a connected to the first row of electrode pads 3a1 out of the electrode pads (3a1, 3a2) arranged in two rows on the main surface of the wiring along the first side 5a of the semiconductor chip 5 extend from the electrode pads 3a1 toward the first side 5a of the semiconductor chip 5, while the wiring lines 4b connected to the second row of electrode pads 3a2 extend from the electrode pads 3a2 toward the side opposite to the first side 5a of the semiconductor chip 5. According to such a construction, the layout pitch of the electrode pads 3a can be made small and hence it is possible to shorten the pad row length of the second row. Besides, with the decrease of the layout pitch of the second row of electrode pads 3a2, it is possible to shorten the layout pitch of the first row of electrode pads 3b1 and hence possible to shorten the pad row length of the first row. As a result, it is possible to diminish the planar size of the wiring board 2 and hence possible to reduce the size of the semiconductor device 1.

Moreover, since the first and second rows of electrode pads 3a1, 3a2 can be approximated to the first side 5a of the semiconductor chip 5, it is possible to shorten the bonding wire length. Consequently, it is possible to prevent the occurrence of short-circuit between adjacent bonding wires due to bonding wire deformation at the time of forming a resin sealing body in accordance with the transfer molding method. As a result, it is possible to improve the manufacturing yield of the semiconductor device 1.

Further, since the layout pitch of the electrode pads on the wiring board 2 is wider than that of the electrode pads on the semiconductor chip 5, the bonding wires extend radially from the semiconductor chip side at an acute angle relative to a phantom line which extends across the center of one side of the semiconductor chip perpendicularly to the one side. In this connection, as the pad row length of the wiring board becomes larger, the angle of bonding wires relative to the aforesaid phantom line becomes smaller. Therefore, when connecting a bonding wire to one of two adjacent electrode pads on the semiconductor chip and thereafter connecting a bonding wire to the other electrode pad, it is possible to prevent interference of a capillary with the bonding wire connected to one electrode pad. As a result, it is possible to improve the semiconductor device manufacturing yield.

In this first embodiment, as shown in FIGS. 5 and 6, out of the electrode pads (3a1, 3a2) arranged in two rows on the main surface of the wiring board 2 along the first side 5a of the semiconductor chip 5, the first row of electrode pads 3a1 stand face to face with the corresponding electrode pads 6a and the second row of electrode pads 3a2 stand face to face with the corresponding electrode pads 6a. According to such a construction it is possible to further shorten the pad row length of the first row and that of the second row and hence possible to further reduce the size of the semiconductor device 1 and improve the semiconductor device manufacturing yield.

The wiring board 2 used in this first embodiment is formed by the semi-additive method. In comparison with the subtractive method, the semi-additive method is high in machining accuracy and affords completed conductor patterns (wiring lines, electrode pads) having little difference between their upper and lower widths, thus making it possible to form wiring lines and electrode pads in high density. Therefore, it is possible to further shorten the pad length of the first row and that of the second row and hence possible to further reduce the size of the semiconductor device 1 and improve the semiconductor device manufacturing yield.

A plating layer is formed on each of the electrode pads of the wiring board 2 for improving the bondability for the bonding wires. The plating layer is formed using an electrolytic plating method which permits plating at low cost. In this case, it is necessary to connect wiring lines for the supply of electric power to the electrode pads. The wiring board 2 used in this first embodiment is of a multi-layer wiring structure having surface and inner wiring layers. Therefore, the wiring lines for the supply of electric power can be distributed using the inner wiring layers of the wiring board 2. Therefore, the wiring lines for the supply of electric power can be connected to the first row of electrode pads 3a1 without being passed between the second rows of electrode pads 3a2.

The wiring board 2 used in this first embodiment is formed by the build-up method. According to the build-up method, an insulating layer and a wiring layer are formed on a core member and wiring layers are built up while connecting adjacent layers to constitute a multi-layer structure. Thus, the wiring distribution freedom is high. Accordingly, electrode pads of a narrow pitch can be arranged with use of the wiring board formed by the build-up method.

In wire bonding wherein the electrode pads 6b arranged on the main surface of the semiconductor chip 5 along the second side 5b and the electrode pads (3b1, 3b2, 3b3) arranged in three rows on the main surface of the wiring board 2 correspondingly to the electrode pads 6*b* are electrically connected together through bonding wires (10*b*1, 10*b*2, 10*b*3), the second row of electrode pads 3*b*2 are arranged in such a manner that the electrode pads 3*b*2 positioned in the same order (sequence) as the third row of electrode pads 3*b*3 counted from the phantom line 5*s* which extends across the center of the second side 5*b* of the semiconductor chip 5 and perpendicularly to the second side 5*b* are more distant from the phantom line 5*s* than the third row of electrode pads 3*b*3. The first row of electrode pads 3*b*1 are arranged in such a manner that the electrode pads 3*b*1 positioned in the same order (sequence) as the second row of electrode pads 3*b*2 counted from the phantom line 5*s* are more distant from the second rows of electrode pads 3*b*2.

The step of electrically connecting the first row of electrode pads 3*b*1 and the corresponding electrode pads 6*b* (a) with each other, the step of electrically connecting the second row of electrode pads 3*b*2 and the corresponding electrode pads 6*b* (b) with each other, and the step of electrically connecting the third row of electrode pads 3*b*3 and the corresponding electrode pads 6*b* (c) with each other, are carried out in this order.

The connection between the bonding wires 10*b*3 and the third row of electrode pads 3*b*3 and the connection between the bonding wires 10*b*2 and the second row of electrode pads 3*b*2 are performed at positions more distant from the second side 5*b* of the semiconductor chip 5 than the connection between the bonding wires 10*b*1 and the first row of electrode pads 3*b*1.

By performing wire bonding in this way, when the capillary comes down to an electrode pad, the distance between the adjacent bonding wire and the capillary is larger than the layout pitch of the electrode pads 6*b*, so that it is possible to prevent interference of the capillary with the adjacent bonding wire and hence possible to improve the manufacturing yield of the semiconductor device 1.

Although in this first embodiment the connection between the bonding wires 10*b*2 and the electrode pads 6*b* (b) is performed at a position more distant from the second side 5*b* of the semiconductor chip 5 than the connection between the bonding wires 10*b*1 and the electrode pads 6*b* (a), the connection between the bonding wires 10*b*2 and the electrode pads 6*b* (b) may be done at a position closer to the second side 5*b* of the semiconductor chip 5 than the connection between the bonding wires 10*b*3 and the electrode pads 6*b* (c). Even in this case there are obtained the same effects as above.

The connection of the bonding wires (10*b*1, 10*b*2, 10*b*3) may be done continuously from one end of the second side 5*b* of the semiconductor chip 5 toward the other end, or may be done continuously from one end and the other end of the second side 5*b* toward the center of the second side 5*b*, or may be done continuously from the center of the second side 5*b* toward one end and the other end of the second side 5*b*.

However, after the first wire bonding step of connecting the electrode pads 6*b* (a) of the semiconductor chip 5 and the first row of electrode pads 3*b*1 of the wiring board 2 with each other through the bonding wires 10*b*1, there is performed the second wire bonding step of connecting the electrode pads 6*b* (b) of the semiconductor chip 5 and the second row of electrode pads 3*b*2 of the wiring board 2 with each other through the bonding wires 10*b*2, and subsequently there is performed the third wire bonding step of connecting the electrode pads 6*b* (c) of the semiconductor chip 5 and the third rows of electrode pads 3*b*3 of the wiring board 2 with each other through the bonding wires 10*b*3.

If the third wire bonding step is carried out after the first wire bonding step, the capillary in the second wire bonding step is apt to interfere with the bonding wires 10*b*3 stretched in the third wire bonding step. Thus, it is important to carry out the first, second and third wire bonding steps in this order.

Second Embodiment

Figure 17:
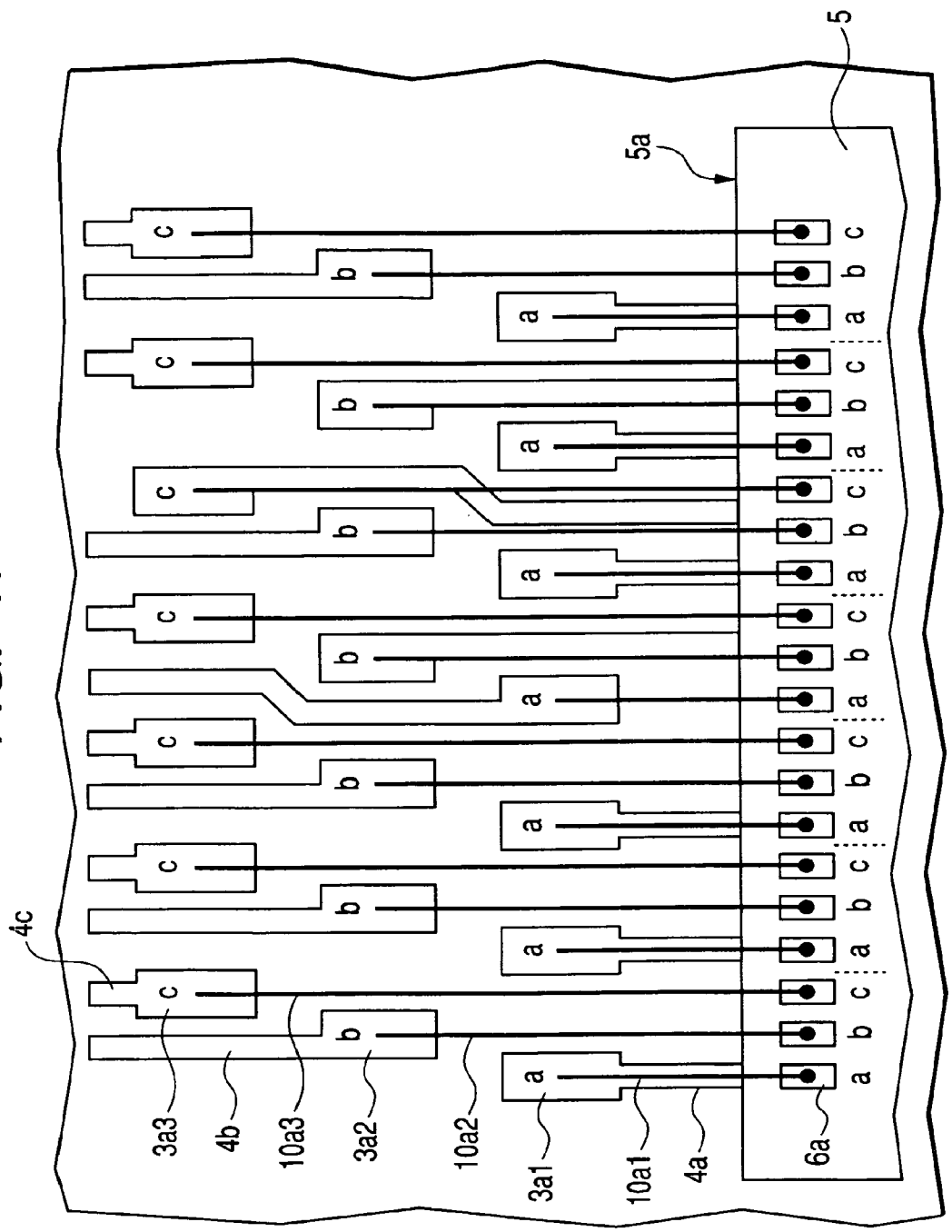
FIG. 17 is a schematic plan view showing a schematic construction of a semiconductor device according to a second embodiment of the present invention.
Figure 18:
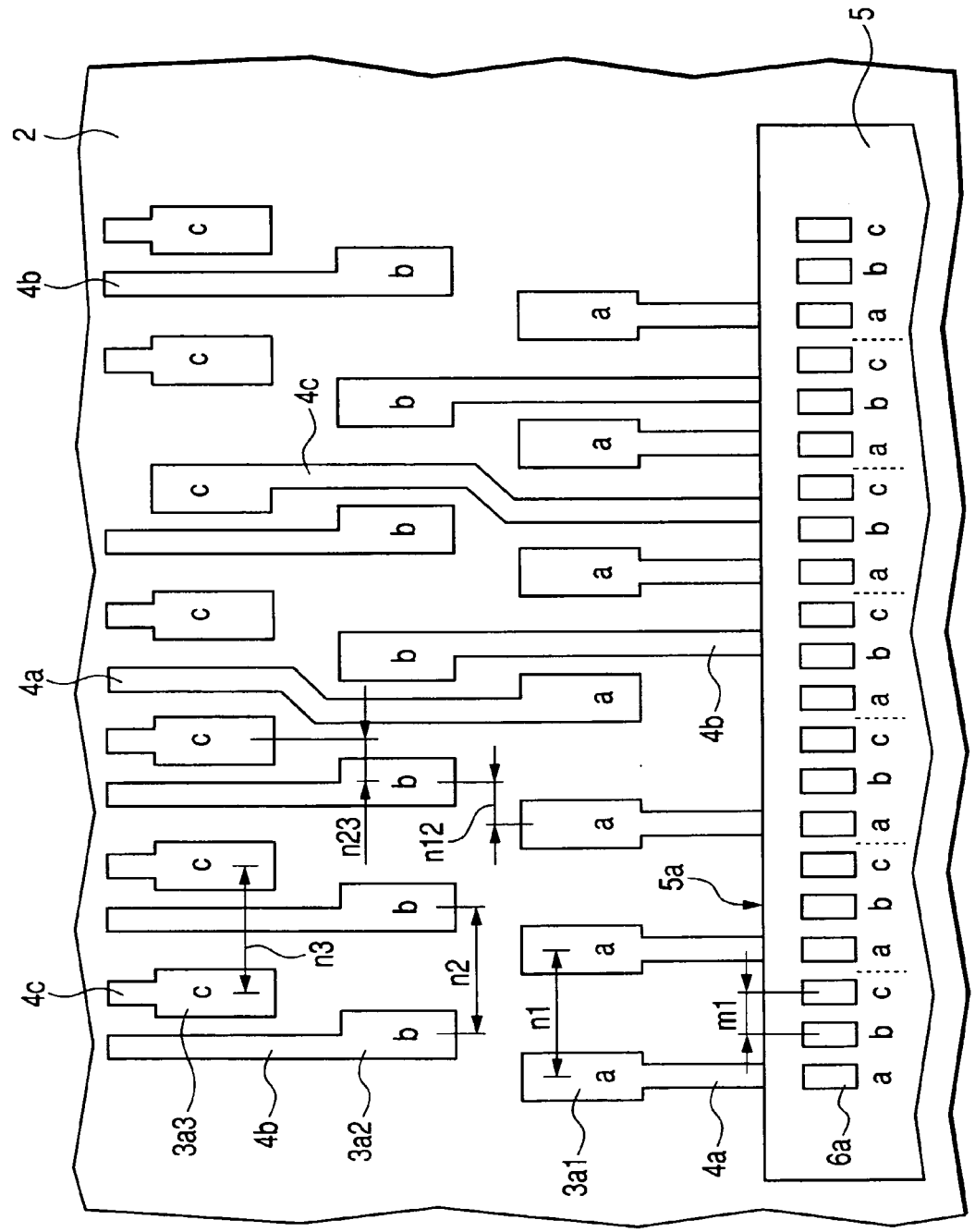
FIG. 18 is a schematic plan view showing an omitted state of bonding wires in FIG. 17.

FIG. 17 is a schematic plan view showing a schematic construction of a semiconductor device according to a second embodiment of the present invention and FIG. 18 is a schematic plan view showing an omitted state of bonding wires in FIG. 17.

This second embodiment is an example in which the present invention for diminishing the layout pitch of pads is applied to a three-row pads layout.

As shown in FIGS. 17 and 18, electrode pads 3*a*1 (a) confront corresponding electrode pads 6*a* (a), electrode pads 3*a*2 (b) confront corresponding electrode pads 6*a* (b), and electrode pads 3*a*3 (c) confront corresponding electrode pads 6*a* (c).

The layout pitch n1 of electrode pads 3*a*1 (a), the layout pitch n2 of electrode pads 3*a*2 (b), and the layout pitch n3 of electrode pads 3*a*3 (c), are three times as large as the layout pitch m1 of electrode pads 6*a* of the semiconductor chip 5 in terms of design values.

The layout pitch n12 between the electrode pads 3*a*1 (a), 3*a*2 (b) and the layout pitch n23 between the electrode pads 3*a*2 (b), 3*a*3 (c) are the same as the layout pitch m1 of the electrode pads 6*a* in terms of design values.

Also in this second embodiment there are obtained the same effects as in the first embodiment.

Additionally, since the layout pitches of electrode pads in the respective rows become large, even if wiring lines are passed between electrode pads, the length of each pad row does not become larger.

Third Embodiment

Figure 19:
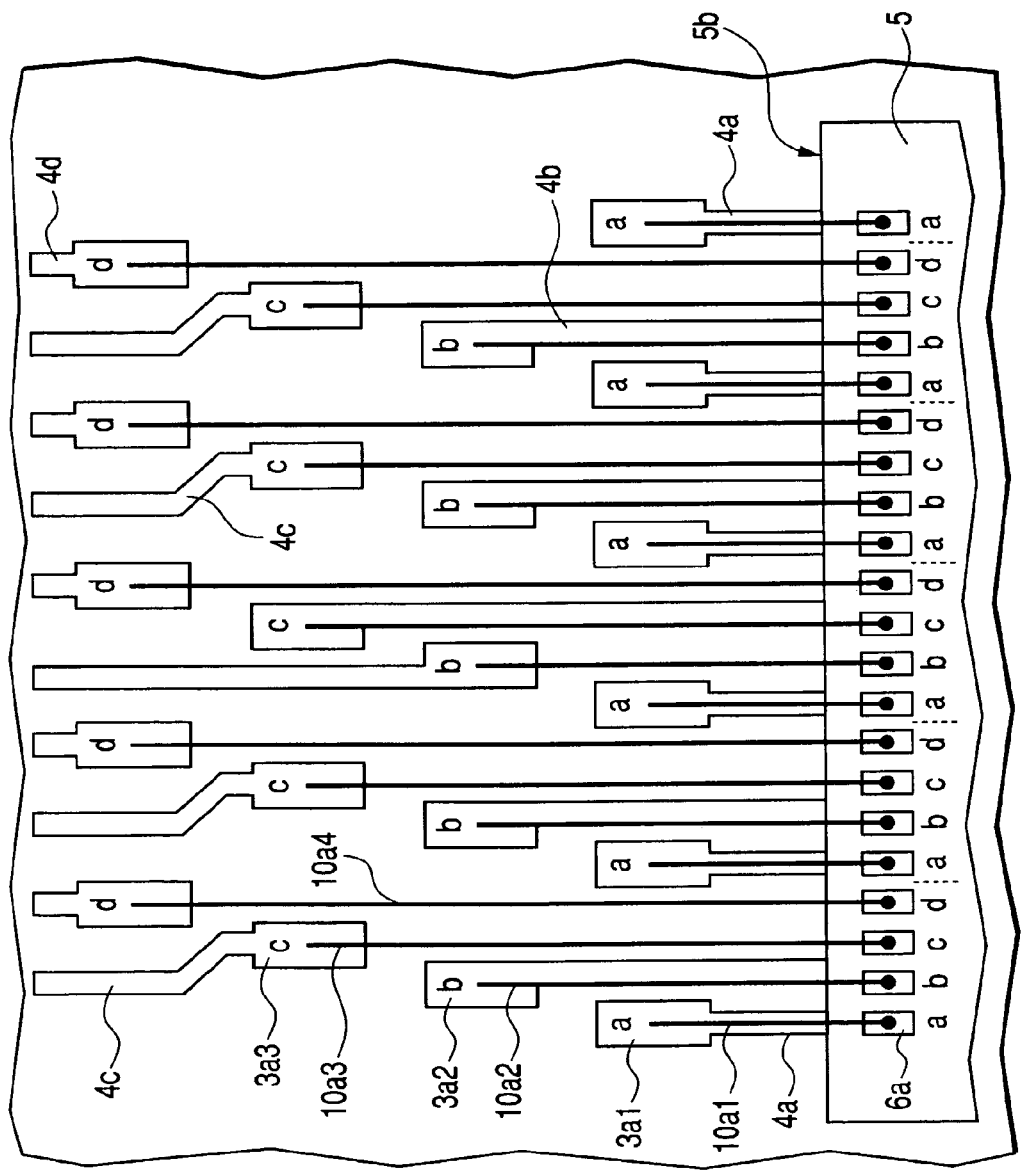
FIG. 19 is a schematic plan view showing a schematic construction of a semiconductor device according to a third embodiment of the present invention.
Figure 20:
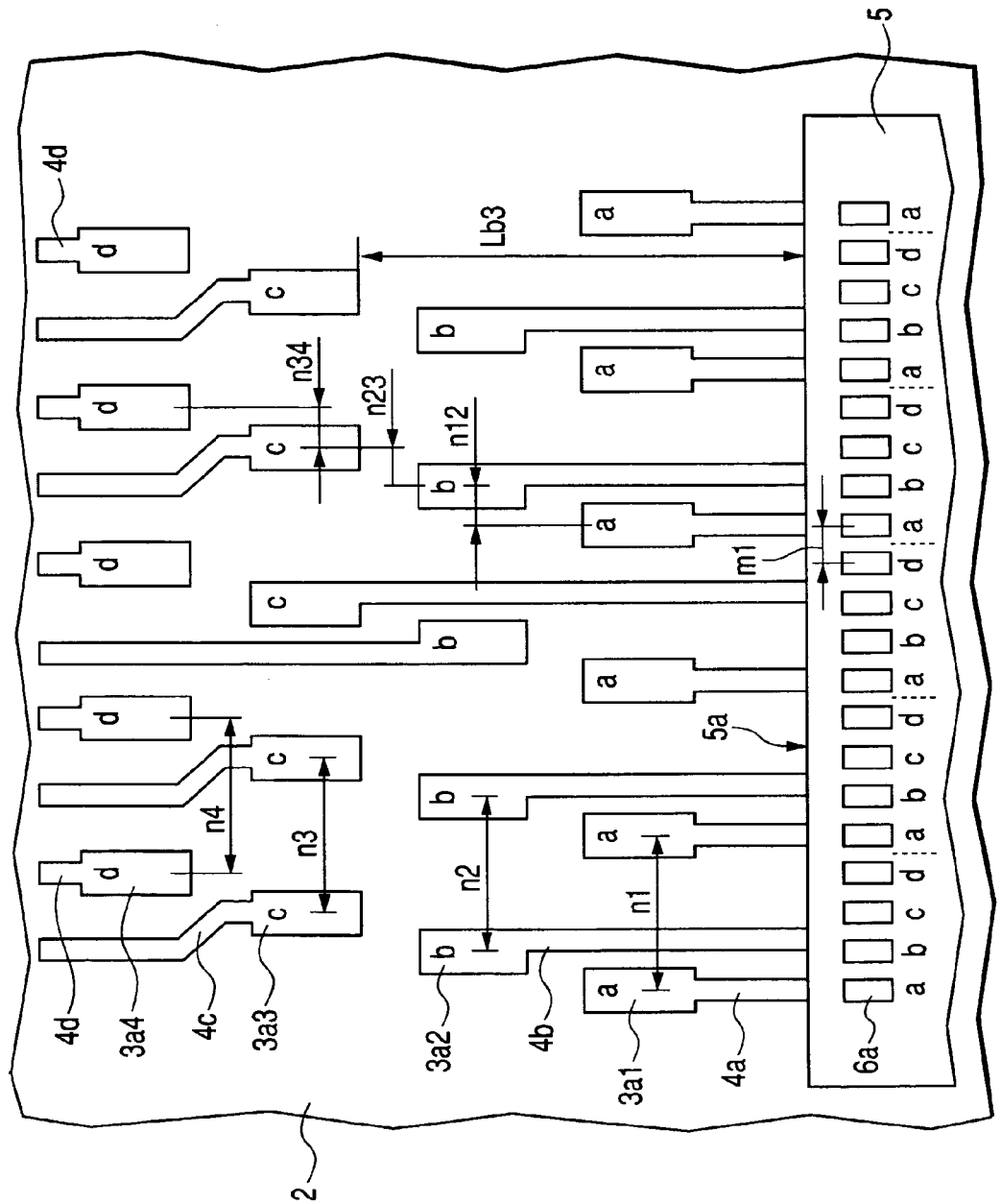
FIG. 20 is a schematic plan view showing an omitted state of bonding wires in FIG. 19.

FIG. 19 is a schematic diagram showing a schematic construction of a semiconductor device according to a third embodiment of the present invention and FIG. 20 is a schematic plan view showing an omitted state of bonding wires in FIG. 19.

This third embodiment is an example in which the present invention for diminishing the layout pitch of pads is applied to a four-row pads layout.

As shown in FIGS. 19 and 20, electrode pads 3*a*1 to 3*a*4 (a to d) confront corresponding electrode pads 6*a* (a to d). The layout pitch n1 of electrode pads 3*a*1 (a), the layout pitch n2 of electrode pads 3*a*2 (b), the layout pitch n3 of electrode pads 3*a*3 (c), and the layout pitch n4 of electrode pads 3*a*4 (d), are four times as large as the layout pitch m1 of electrode pads 6*a*.

The layout pitch n12 between the electrode pads 3*a*1, 3*a*2, the layout pitch n23 between the electrode pads 3*a*2, 3*a*3, and the layout pitch n34 between the electrode pads 3*a*3, 3*a*4, are the same as the layout pitch m1 of the electrode pads 6*a* in terms of design values.

Also in this third embodiment there are obtained the same effects as in the first embodiment.

Additionally, since the layout pitches of electrode pads in the respective rows become large, even if wiring lines are passed between electrode pads, the length of each pad row does not become larger.

Fourth Embodiment

Figure 21:
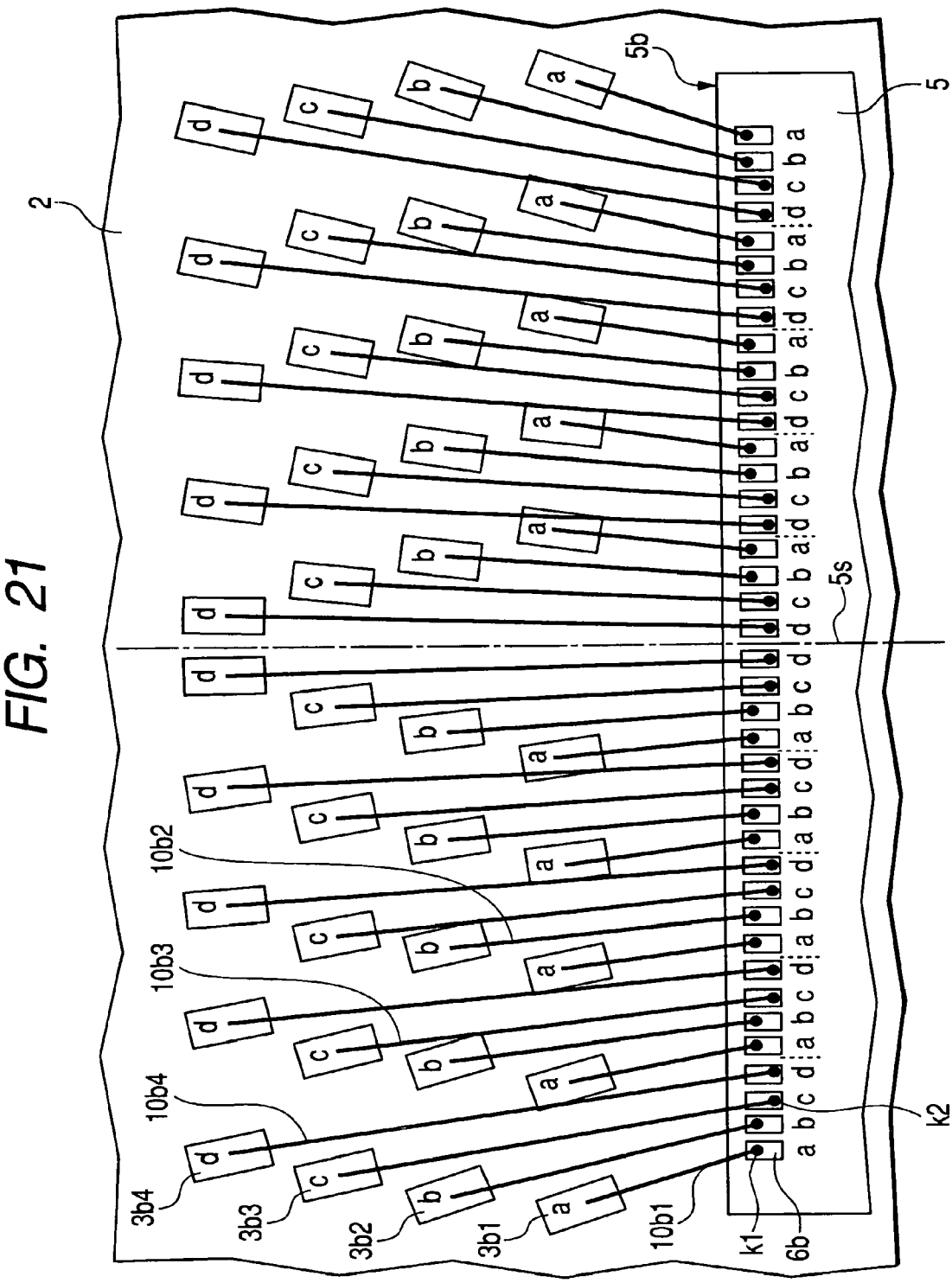
FIG. 21 is a schematic plan view showing a schematic construction of a semiconductor device according to a fourth embodiment of the present invention.

FIG. 21 is a schematic plan view showing a schematic construction of a semiconductor device according to a fourth embodiment of the present invention.

This fourth embodiment is an example in which the present invention for preventing the interference of the capillary is applied to a four-row pads layout. Also in this fourth embodiment there are obtained the same effects as in the first embodiment.

Additionally, electrode pads may be arranged in four or more rows insofar as the position initially connected with a bonding wire and the position lastly connected with a bonding wire satisfy a zigzag layout relation.

Although the present invention has been described above concretely by way of the above embodiments, it goes without saying that the present invention is not limited to the above embodiments, but that various changes may be made within the scope not departing from the gist of the invention.

What is claimed is:

1. A method of manufacturing a semiconductor device, comprising the steps of:
   (a) providing a wiring substrate including an upper surface having a first side, a chip mounting portion formed on the upper surface, a plurality of first connecting portions arranged along the first side and arranged between the first side and the chip mounting portion in a plan view, a plurality of second connecting portions arranged along the first side and arranged between the first side and the plurality of first connecting portions in the plan view, a plurality of third connecting portions arranged along the first side and arranged between the first side and the plurality of second connecting portions in the plan view, and a lower surface opposed to the upper surface;
   (b) mounting a semiconductor chip on the chip mounting portion, the semiconductor chip including a front surface having a second side, a plurality of bonding pads arranged along the second side, and a rear surface opposed to the front surface, the plurality of bonding pads including a plurality of first bonding pads, a second bonding pad and a third bonding pad, the plurality of first bonding pads having an outside bonding pad and an inside bonding pad, the second bonding pad being arranged between the outside bonding pad and the inside bonding pad, and the third bonding pad being arranged between the second bonding pad and the inside bonding pad;
   (c) electrically coupling the plurality of first bonding pads and the plurality of first connecting portions with a plurality of first bonding wires;
   (d) after the step (c), electrically coupling the second bonding pad and one of the plurality of second connecting portions with a second bonding wire such that a part of the second bonding wire is located above the plurality of first bonding wires; and
   (e) after the step (d), electrically coupling the third bonding pad and one of the plurality of third connecting portions with a third bonding wire such that a part of the third bonding wire is located above the second bonding wire;
   wherein a shape, in the plan view, of each of the plurality of bonding pads is a rectangular shape including a first part and a second part located farther than the first part from the second side in the plan view;
   wherein in the step (c), each first bonding wire is connected with the first part of a corresponding one of the plurality of first bonding pads;
   wherein in the step (e), the third bonding wire is connected with the second part of the third bonding pad; and
   wherein, in the plan view, the plurality of first bonding wires, the second bonding wire and the third bonding wire extend from the plurality of bonding pads at acute angles with respect to a phantom line which is perpendicular to the second side and which intersects a center of the second side.

2. The method of manufacturing a semiconductor device according to claim 1, wherein the steps (c), (d) and (e) are performed using a capillary.

3. The method of manufacturing a semiconductor device according to claim 2, wherein after the step (e), the semiconductor chip, the plurality of first bonding wires, the second bonding wire and the third bonding wire are sealed with resin.

4. The method of manufacturing a semiconductor device according to claim 3, wherein after sealing the semiconductor chip, the plurality of first bonding wires, the second bonding wire and the third bonding wire with resin, a plurality of external connecting terminals are formed on the lower surface of the wiring substrate.

* * * * *